US006389139B1

(12) United States Patent
Curtis et al.

(10) Patent No.: US 6,389,139 B1
(45) Date of Patent: May 14, 2002

(54) POWERED VOLUME CONTROL FOR DISTRIBUTED AUDIO SYSTEM

(75) Inventors: Jerry A. Curtis, Buena Park; James E. Peterson, Jr., Mission Viejo, both of CA (US)

(73) Assignee: Dana Innovations, San Clemente, CA (US)

( * ) Notice: Subject to any disclaimer, the term of this patent is extended or adjusted under 35 U.S.C. 154(b) by 0 days.

(21) Appl. No.: 08/972,868

(22) Filed: Nov. 18, 1997

(51) Int. Cl.[7] .................................................. H03G 3/00

(52) U.S. Cl. .......................... 381/105; 381/77; 381/104

(58) Field of Search .......................... 381/28, 120, 105, 381/77, 82, 79, 104, 107, 109; 340/310.01

(56) References Cited

U.S. PATENT DOCUMENTS

| | | | | |
|---|---|---|---|---|
| 3,195,067 A | | 7/1965 | Klein et al. | |
| 3,370,125 A | | 2/1968 | Shaw et al. | |
| 4,490,683 A | | 12/1984 | Rhee | |
| 4,809,339 A | | 2/1989 | Shih et al. | |
| 4,984,931 A | | 1/1991 | Struthers et al. | |
| 4,991,221 A | | 2/1991 | Rush | |
| 5,164,991 A | | 11/1992 | Johnson et al. | |
| 5,175,770 A | | 12/1992 | Back | |
| 5,332,976 A | | 7/1994 | Dunnebacke | |
| 5,361,381 A | * | 11/1994 | Short | 381/28 |
| 5,410,265 A | * | 4/1995 | Jain et al. | 381/109 |
| 5,546,468 A | | 8/1996 | Beard | |
| 5,579,397 A | | 11/1996 | Ikeda et al. | |

FOREIGN PATENT DOCUMENTS

| | | | | |
|---|---|---|---|---|
| AU | PCT/AU98/00647 | | 2/1999 | |
| JP | 60-21693 | * | 2/1985 | 381/77 |

OTHER PUBLICATIONS

SONANCE Distributed Audio Product Catalog dated Apr. 1, 1997.

Electrical Engineering Reference Manual, Professional Publications, Belmont, CA. p. 9–2.

The VCA1, ASW1 & In–Wall Remote Owners Manual by Sonance.

National Semiconductor, LM1875 20 Watt Power Audio Amplifier brochure.

DU3 Users Guide.

"Distributed Sound Systems Come of Age" Dec. 20, 1993 issue of Sound & Video Contractor . , Intertec Publishing Corp., Overland Park, K.S.

IMP Systems, Inc. brochure—Downtown Streets are Alive with the Sound of Music.

* cited by examiner

*Primary Examiner*—Xu Mei
(74) *Attorney, Agent, or Firm*—Stetina Brunda Garred & Brucker

(57) ABSTRACT

A powered volume control is provided for a distributed audio system having a plurality of remote speakers. An amplifier or signal conditioner is provided having a dual channel amplified signal from a high impedance source. The amplified or conditioned signal is provided to a plurality of remotely located powered volume controls having high input impedance and further having internal amplifiers which provide a dual or mono-channel amplified signal having an amplitude or magnitude determined by a user variable adjustment device. The amplified signal is then provided to one or more remote speakers. Each volume control is designed for in-wall installation in a single-gang wall box and may be covered by an ornamental face plate. The system is also designed to utilize existing four conductor speaker wire for installation or retrofitting existing distributed audio systems.

125 Claims, 11 Drawing Sheets

POWERED VOLUME CONTROL FOR DISTRIBUTED AUDIO SYSTEM

BACKGROUND OF THE INVENTION

1. Field of the Invention

The present invention relates to an audio signal amplification and distribution system for multiple speaker applications, and, in particular, to a new and improved wall-mounted "powered" volume control having an integrated audio power amplifier for connecting between a signal source and one or more remote speakers.

2. Description of the Related Art

Broadcasting audio or music, such as background music, within a facility is generally desirable to provide a relaxing or entertaining atmosphere or to enhance a desired theme or mood. In particular, buildings such as houses, hotels, restaurants, casinos, shopping malls, and other indoor or outdoor areas often are equipped with sound distribution systems to provide music and paging capability to different locations in or around the building or area.

One simple way to provide a distributed audio sound system is to provide a number of individual signal sources and amplifiers throughout the building or area. While such a sound system may be acceptable for distributing AM or FM radio broadcasts, it would typically not be suitable for rebroadcast of an audio recording or public address message since the music or sound may not be synchronized from room-to-room. Also such sound systems necessitate multiple signal sources which can increase the costs of the system significantly, particularly if high fidelity sound reproduction is desired. For these reasons, it is generally preferred to use a single high-fidelity signal source.

A typical commercial high-fidelity sound distribution system provides for a single signal source and amplifier to provide a signal to a plurality of speakers distributed throughout a building or area. Systems of this nature advantageously provide synchronized music or paging capability to multiple areas of a building or facility. However, such systems have certain undesirable limitations or disadvantages. One disadvantage is the reduced impedance to the amplifier created by having a plurality of speakers connected to a single amplifier. Connecting too low an impedance (i.e., too many speakers) to an amplifier can overload and possibly damage the amplifier. Another disadvantage is that in large buildings a number of the speakers may be located great distances (e.g., over 100 feet) from the amplifier. Speaker wire has electrical properties of resistance, capacitance and reactance, all of which can impede or alter the transmitted audio signal, thereby causing poor audio output. This is especially true when low voltage or high-current signals are transmitted over great distances of wire.

Another limitation of traditional single amplifier systems is that the amplifier must be able to produce adequate power to operate a plurality of speakers. For large installations, the required high power amplifiers can be particularly expensive because larger and more expensive components must be used to produce the significant amounts of electrical power required. Also, the number of speakers available will be limited by the maximum power output of the central amplifier, making further expansion of the system difficult.

Another disadvantage of traditional single amplifier systems is that each speaker will produce music or a page at approximately the same volume. This may be undesirable in many applications where different audio levels may be required for different areas of a building or facility. For example, a lounge or bar area in a hotel may require music at a higher volume than in the lobby or dining areas. Thus, in such systems it is desirable to provide a means for independently adjusting the volume in each area to compensate for ambient background noise or to set a particular mood or tone suitable for each particular area.

Over the years, various devices have been proposed to provide for localized volume control. One early proposed solution was to provide a multichannel amplifier. A multichannel amplifier has a number of different channels, each having a separate volume control, and which may be used to individually control or adjust the signal strength or power provided to each speaker pair or each speaker in a single channel system. However, multichannel amplifiers are quite costly and the installer or owner is still limited in the number of speakers that the system may operate by the number of channels available on the amplifier and the maximum power output for each channel. Also, the volume control is usually located on the amplifier itself, making localized adjustment of remote speakers inconvenient. Furthermore, using a multichannel amplifier necessitates running wire between each speaker and the amplifier.

A more widely accepted solution is to provide an adjustable autoformer in series with each local speaker pair to selectively attenuate the audio signal provided to the local speakers. For example, U.S. Pat. No. 4,809,339 to Shin et al. describes one type of autoformer suitable for localized audio signal attenuation. Such autoformers typically comprise a plurality of user selectable transformer coils connected between the central amplifier and the local speaker pair. Depending upon the position of a switch or selector knob, more or less reactance and/or resistance is placed in series with the speaker pair to limit or attenuate the amount of power delivered, accordingly.

Although such autoformers provide limited localized volume adjustment of remote speakers they suffer from a number of disadvantages which have yet to be overcome by any known prior art systems. In particular, autoformer volume controls are often inconvenient in that volume control is not continuous. In other words, the volume may only be set at one of several (usually 8 to 12) discrete levels. Thus, a desired volume level located between two autoformer steps may not be achieved. Such volume controls are also undesirable where high-quality or high-fidelity audio sound output is desired. Autoformers have significant reactance to diminish the power delivered to the speakers. Passing an audio signal through an autoformer undesirably distorts the audio signal by introducing capacitance, resistance, and phase distortion at various frequencies in the audio range. In particular, the high and low frequencies of the audio signal are lost or greatly diminished when the signal passes through a transformer. Also, when several autoformers are connected together on a given output channel, the adjustment of one volume control will often result in a change of volume in an adjacent area due to the change in overall load reactance. Thus, such volume controls are not completely independently adjustable.

Other volume controls are known which suffer from similar or other drawbacks. For example, variable resistive ladders, also commonly known as an "L-pad" or rheostat, have also been used to control the volume of the audio from one or more local speaker pairs. The resistive ladder allows the user to selectively increase or decrease the resistance in the line between the speaker and the amplifier to attenuate the audio signal. However, variable resistive ladders suffer from the additional drawback of undesirably generating significant heat and, thus, are not efficient and require extensive cooling or other heat dissipating means.

It is also known to incorporate amplifier/power boosters in a speaker itself. For example, U.S. Pat. No. 4,991,221 to Rush describes an amplifier and a speaker in a single enclosure. However, these types of systems are not well-suited for retrofit installations because the amplifier circuit requires a separate power supply line in addition to the speaker signal lines. Also, the signal quality for speaker/amplifier pairs located at extended distances from the original audio source will still suffer significant degradation due to the resistance, capacitance and inductance of the speaker wire and the relatively low signal input impedance of the amplifier/booster circuit (typically on the order of 100 Ohms). Furthermore, the gain control for such amplifier/booster circuits is typically located behind the speaker housing. This is undesirable for the vast majority of commercial and residential applications in which the speakers are typically located in inaccessible places such as on ceilings or walls out of reach.

A need exists, therefore, for a high-quality audio system for remote, multi-speaker operation which provides the capability for local continuous volume adjustment without significant signal degradation in a convenient inexpensive retrofittable system.

SUMMARY OF THE INVENTION

The present invention generally provides a simple, cost efficient, high-fidelity audio distribution system and method for providing a high-quality audio signal to numerous areas or rooms within a building or other facility. The present invention further provides the capability for users to make localized and continuous volume adjustment of remote speakers without significant noise or signal distortion. The system generally comprises one or more amplifiers and/or signal conditioners located at or near the audio source for receiving a signal from the audio source and generating an amplified audio signal which is transmitted over extended distances to one or more "powered" volume controls. Each volume control receives the amplified (low current, low resistance) signal from the amplifier and/or signal conditioner using a high-impedance input/attentuator. Desirably, this avoids unduly loading the amplifier and/or signal conditioner. Each volume control then amplifies the attenuated signal to a level determined by a user controlled adjustment device such as a variable resistor or potentiometer. Speakers are connected to the signal outputs of each volume control and receive the amplified audio signal to reproduce the music or page at the desired amplified volume level.

In accordance with one preferred embodiment the present invention comprises a powered volume control for connecting between an audio source and one or more remote speakers. An input circuit receives an audio signal from the audio source and provides a preamplified signal output. This signal is amplified by an amplifier circuit to provide an amplified signal output which is a substantial replication of the preamplified signal and the audio signal from the audio source. For the purposes of the present application, the term "replication" means a generally identical version (notwithstanding distortion introduced from the circuitry) of the original signal but which may be scaled up or down in amplitude due to the attenuator or amplifier. Accordingly, the replication may be identical to, of greater magnitude, or of lesser magnitude than the original signal. It is further contemplated that the replicated signal may comprise a digitized version of the original signal.

The amplified signal output is then used to drive one or more remote speakers. To allow volume control of the remote speakers a variable adjustment device is provided. This can be adjusted by a user to change the magnitude of the preamplified signal and/or the gain or bias of the amplifier circuit such that the amplified signal output can be continuously adjusted over a predetermined range to adjust the volume of the one or more remote speakers. Advantageously, the circuitry is configured to eliminate interference, particularly in the low frequency range, from adjacent AC power sources or other sources of interference by grounding the output terminal or connector.

In accordance with another preferred embodiment the present invention comprises a wall-mounted volume control for connecting between an amplified audio signal source and one or more remote speakers. An input circuit having a relatively high input signal impedance is adapted to receive a first amplified audio signal from the amplified audio signal source to produce an attenuated audio signal having a predetermined magnitude or range of magnitudes. An amplifier circuit receives the attenuated signal and provides a second amplified signal output which is a substantial replication of the attenuated signal and the first amplified signal from the amplified audio signal source. The amplified signal is then used to drive one or more remote speakers. To adjust the volume of the speakers a variable adjustment device is provided which allows a user to adjust the magnitude of the second amplified signal such that speaker volume can be adjusted over a predetermined range.

In accordance with another preferred embodiment the present invention comprises an audio distribution system for distributing an audio signal from one or more audio sources to one or more speakers located remotely from the audio sources. A first amplifier is provided and is adapted to be located at or near the one or more audio signal sources for receiving an audio signal input from said one or more audio signal sources. The first amplifier provides a first amplified signal output which is substantially a replication of the audio signal input. A second amplifier is also provided and is adapted to be located in an accessible location on a wall remotely from the one or more audio signal sources and electrically connected between the first amplifier and the remote speakers. The second amplifier has a relatively high input signal impedance and a relatively low output signal impedance and is adapted to receive the first amplified audio signal from the first amplifier and to provide an intermediate attenuated audio signal having a predetermined magnitude or range of magnitudes. The second amplifier is further adapted to amplify the attenuated audio signal to provide a second amplified signal to drive the one or more remote speakers. The second amplified signal is a substantial replication of the attenuated audio signal and the first amplified signal. A variable adjustment device is further provided for allowing a user to adjust the magnitude of the second amplified signal whereby the volume of the one or more remote speakers can be adjusted over a predetermined range.

In accordance with another preferred embodiment the present invention comprises a method for distributing an audio signal from one or more audio sources to one or more speakers located remotely from the audio sources. According to the method the audio signal input from one or more audio signal sources is amplified to provide a first amplified signal output which is substantially a replication of the audio signal input. The first amplified signal has an amplitude or magnitude such that it is relatively impervious to spurious noise. The first amplified signal is then transmitted through an elongated electrical conductor to one or more remote locations near one or more remote speakers. The first amplified signal is then passed through a variable resistor to produce an attenuated audio signal having a desired amplitude or magnitude as determined by a user variable adjustment device. The attenuated signal is then amplified to provide a second amplified signal which is transmitting along one or more electrical conductors to drive the one or more remote speakers. The method allows for localized speaker volume control of remote speakers with less noise interference and distortion than methods utilizing conventional autoformer volume controls.

These and other embodiments of the present invention will be readily apparent to those skilled in the art having reference to the detailed description and drawings which follow, the invention not being limited, however, to any particular embodiments disclosed.

DETAILED DESCRIPTION OF THE PREFERRED EMBODIMENT

Figure 1:
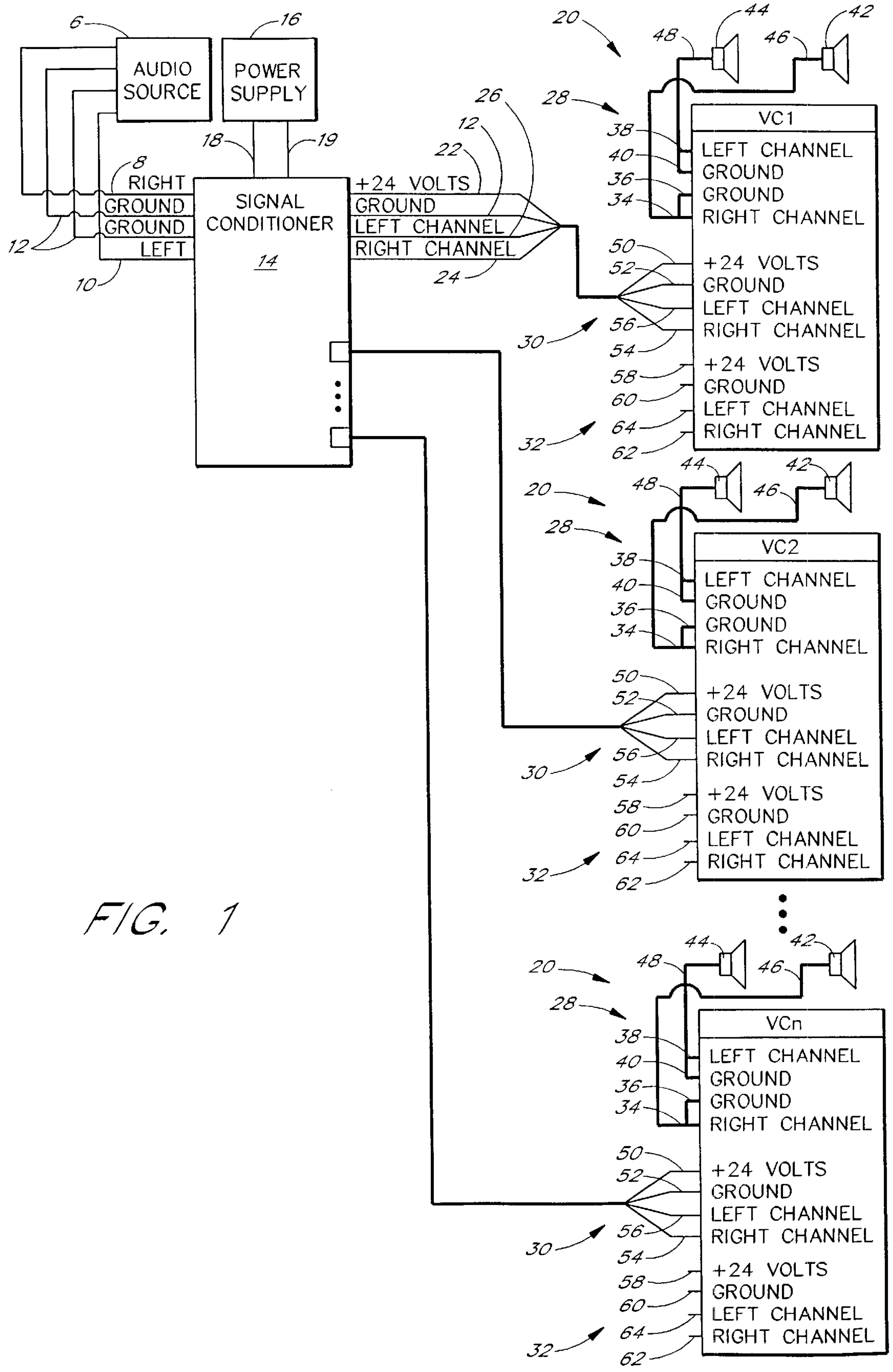
FIG. 1 is a schematic illustration of one preferred embodiment of a distributed audio system having features of the present invention.

FIG. 1 illustrates the general arrangement and connection of a distributed audio system having features in accordance with one preferred embodiment of the present invention. The system generally comprises an audio source 6 having a right channel signal output line 8 and left channel signal output line 10. Both the right channel 8 and the left channel 10 are referenced to a respective ground 12. The audio source 6 provides an electrical signal representing an audio signal and may further generate a stereo signal representing a variance in the signal between the right channel 8 and the left channel 10. The audio source may comprise any number of suitable audio sources, including, without limitation, a radio tuner/receiver, tape player, phonograph, compact disc player, microphone or similar devices. Alternatively, or in addition, a public addressing system (not shown) may integrate with the audio source 6 to provide for the transmission of a paging signal through the audio system.

The output from the audio source 6 connects to an audio amplifier (or in this case an optional signal conditioner 14) through electrical connectors. The signal conditioner 14 may be located up to about 100 feet or more from the audio source 6, but is preferably located within about 30 feet from the audio source and is most preferably located within about 10 feet from the audio source. The signal conditioner 14 amplifies the audio signal to a suitable level for components receiving the audio signal from the signal conditioner. The signal conditioner 14 generally comprises input terminals, internal amplifier circuitry, and signal output connectors, as shown. In an alternative embodiment, a balanced output from the audio source and suitable conductors may allow for locating audio source 6 up to 500 feet from the signal conditioner 14, if desired.

An external power supply 16 preferably provides 24 volts DC on a power supply line 18 referenced to a common ground line 19 to the signal conditioner 14. Suitable power supplies providing voltage regulated DC current are known by those skilled in the art and, accordingly, they are not described in detail herein. A power line 22 connects to the signal conditioner 14 and extends through the system to a plurality of powered volume controls 20. Those of ordinary skill in the art realize that the power supply 16 could alternatively be internal to the signal conditioner 14 and/or each powered volume control 20 or it could be configured to operate on other voltages.

Those of ordinary skill in the art will also appreciate that the system can be configured to work without the signal conditioner 14, using a conventional amplifier or direct connection. For example, the volume control 20 could be connected to the output channel of a conventional amplifier or directly to the audio signal source 6. The signal conditioner 14 is preferred, however, to amplify the signal to a desired predetermined level for transmission over significant distance and to provide a plurality of parallel output terminals, if desired.

The signal conditioner 14 provides the right channel line 24, the left channel line 26, a power line 22 and ground 12 to each of a plurality to volume controls 20. The volume control 20 provides user adjustable amplification of the audio signal and provides the amplified signal to one or more speakers. Preferably, each volume control 20 powers two speakers. Each volume control 20 has a speaker output connector block 28, an input connector block 30, and an output connector block 32 and, as shown, each of which has four terminals. Each volume control amplifies the audio signal from the signal conditioner, and transmits the amplified signal to a pair of remote speakers. Each volume control, is preferably located as near as possible to the speakers in a convenient, accessible place. Advantageously, the volume control has a high input impedance thereby enabling a plurality of volume controls to connect to a single signal conditioner without undesirably placing too low an impedance load on the signal conditioner 14 or other amplifier.

The speaker connector block 28 comprises a right channel terminal 34 and right ground terminal 36 and a left channel terminal 38 and left ground terminal 40. A right speaker 42 connects via a right speaker line pair 46 to the right channel speaker terminal 34 and right channel ground terminal 36. A left speaker 44 connects via a left speaker line pair 48 to the left channel speaker terminal 38 and left channel ground terminal 40.

The input connector block 30 comprises a power input terminal 50 which connects to the power supply line 22, a ground terminal 52 which connects to the ground 12, a right channel input terminal 54 for receiving the right channel audio signal, and a left channel input terminal 56 for receiving the left channel audio signal. The four lines from the signal conditioner 14 connect to the volume control 20 at the input connector block 30. Alternatively, for mono-channel or monophonic applications a three conductor wire could be used to carry power, the audio signal and ground to the volume controls 20. The output connector block 30 comprises a power output terminal 58 which provides power to other parallel connected volume control 20, a ground terminal 60 which connects to the ground 12, a right channel output terminal 62, and a left channel output terminal 64.

Internal to the volume control 20 and as described in more detail herein is circuitry which amplifies the incoming signal for right and left channel speakers 42, 44. A user-adjustable variable adjustment device such as a voltage divider, variable resistor, potentiometer or similar device controls the magnitude of the signal provided to the amplifier 102 thereby providing for continuously variable volume level adjustment. The amplified signal is output to the speaker connector block 30 to which the right speaker line pair 46 and left speaker line pair 48 connect and thereby feed the signal to a right speaker 42 and a left speaker 44, respectively.

Volume Control Housing

Figure 2:
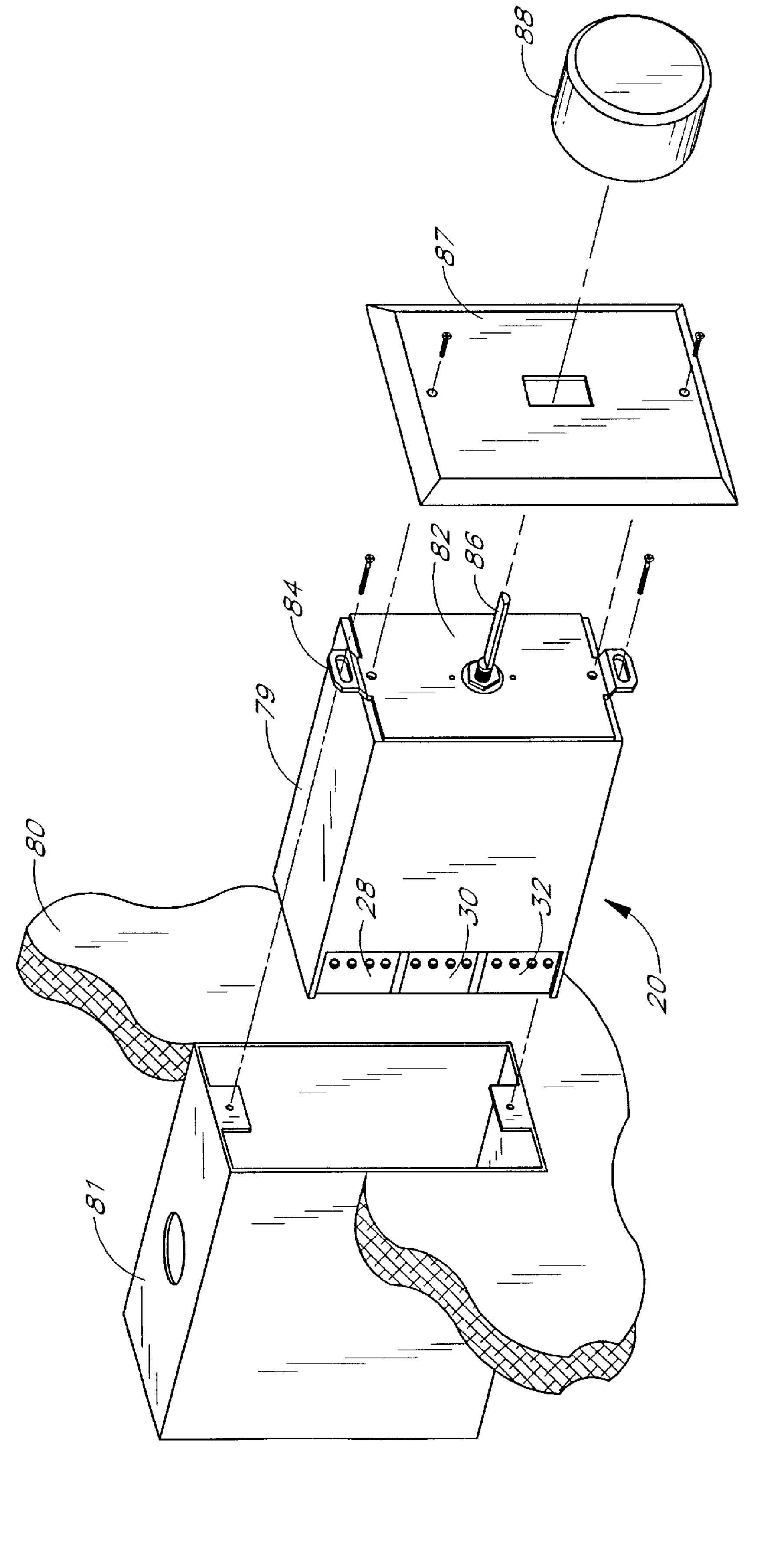
FIG. 2 is an exploded perspective view of a powered volume control having features of the present invention.

FIG. 2 illustrates one preferred configuration of a volume control 20 adapted to be installed in a wall 80. Advantageously, the volume control 20 is configured to fit within an electrical wall box or other type enclosure placed in a wall, including, but not limited to, a single, double, or multi-gang wall box, a plaster ring, a face plate mount or a partially in-the-wall partially out-of-the-wall box. Alternatively, the entire control may be aesthetically located outside the wall in a box or control panel, if desired, or one or more remote hand-held units such as infrared controls may also be used.

The outer housing 79 of the volume control 20 is preferably constructed of an electrically nonconductive material. Alternatively, the housing 79 may be constructed of metal that is electrically isolated from the internal circuitry contained within. The speaker connector block 28, input connector block 30, and output connector block 32 are provided at the back of the volume control 20, thereby providing terminals to connect the volume control 20 to the signal conditioner 14, speakers 42, 44, and/or other volume controls. The front of the volume control 20 has a mounting bracket or yoke 82 having pre-formed holes or openings 84 for securing the volume control to a wall box 81 via suitable screws or other fasteners. Advantageously, the entire volume control 20 is preferably sized to fit within a single gang wall box 81. The mounting bracket holes 84 are located accordingly to mount the volume control in a standard single gang box, using screws or other attachment device.

The above construction provides significant advantages over prior art devices because in-wall mounted volume controls are more convenient to operate than centralized volume controls or volume controls integrated in a speaker booster circuit. Furthermore, integrating the high power amplification capability with high-quality audio signal reproduction in a wall box volume control is a significant advance over systems of the prior art, especially when considered in view of the added flexibility provided for installing such powered volume controls as a retrofit or replacement for existing autoformer attenuators. Suitable electrical boxes 81, either single-gang or multi-gang, are common in both commercial and residential electrical wiring systems and are readily available. Alternatively, other in-wall mounting options exist, such as plaster mounting rings and the like, and are contemplated for use with this preferred embodiment of the present invention.

A stem 86 of a variable adjustment device, such as a potentiometer or trim pot extends from a hole formed in the yoke 82 of the volume control 20 providing means to control the level of amplification of the audio signal, i.e. the volume for each the right channel and the left channel. It is contemplated that connected to the stem 86 may be a potentiometer control knob 88 which may be of the slider bar, rotating knob, or digital push button type, as desired. A decorative face plate 87 preferably covers the exposed front of the mounting bracket 82 to provide an aesthetic installation. While a wall mounted volume control is disclosed, those skilled in the art will readily appreciate that additional controls could also be incorporated, as desired, such as balance, treble, and/or bass adjustment.

Signal Conditioner Circuitry

Figure 3:
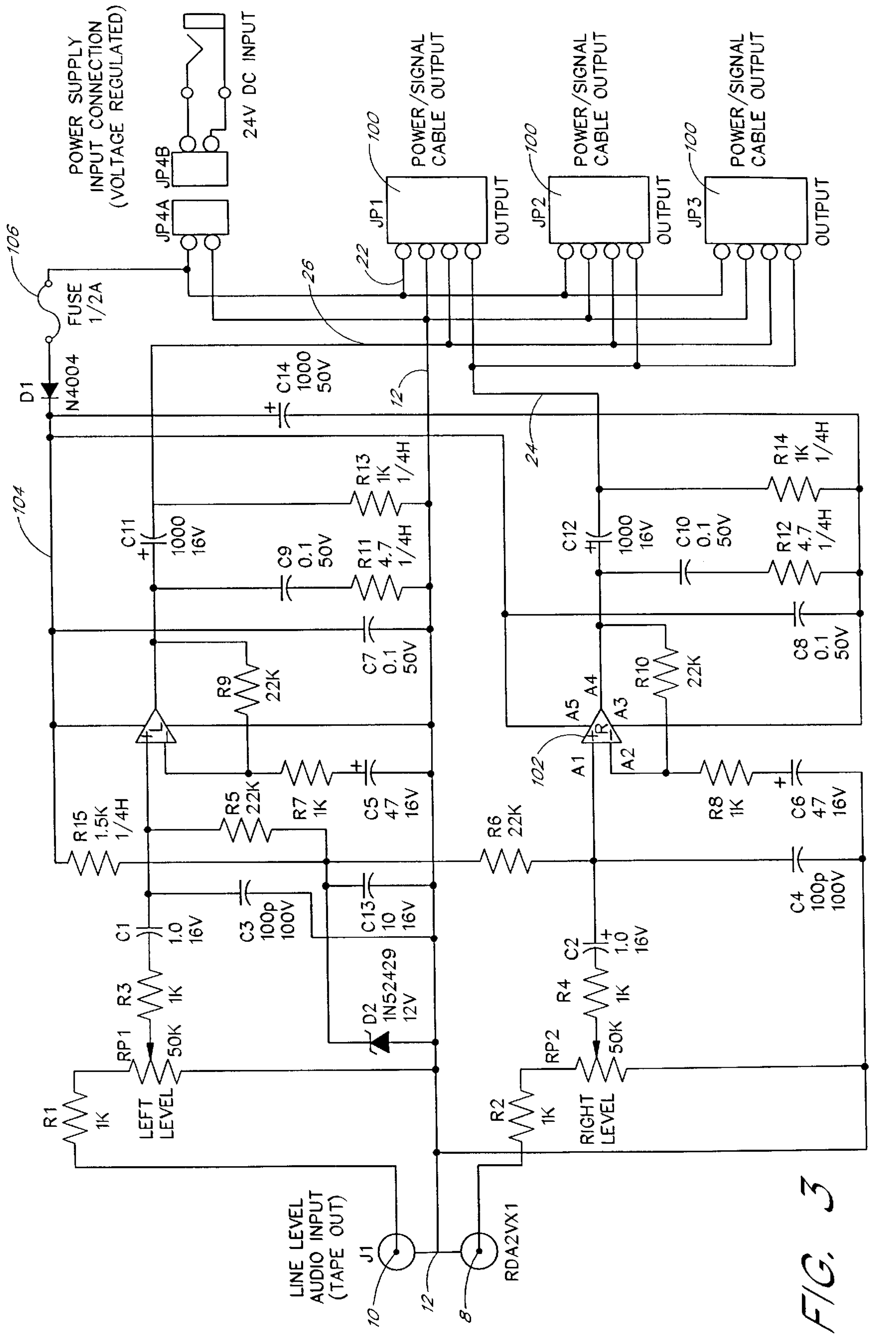
FIG. 3 is an electrical schematic diagram of an optional signal conditioner having features of the present invention.

FIG. 3 more fully illustrates the internal componentry of the signal conditioner 14 shown in FIG. 1. Note that preferred component values and device specifications are given for illustrative purposes only and should not be construed as limiting the invention herein disclosed.

The signal conditioner 14 generally comprises a two channel amplifier each having gain determined by a variable resistor potentiometer, and a plurality of signal conditioner output connector blocks 100. Advantageously, the signal conditioner 14 appears as a very high impedance to the signal source thereby preventing the signal conditioner from distorting or overloading the signal source. The signal conditioner 14 is preferably powered by a 24-volt regulated power supply which also powers each volume control connected thereto. A voltage of 24 VDC is preferred in order to maintain the “low voltage” status of the product.

The signal conditioner 14 amplifies the audio signal for transmission to a plurality of volume controls 20. A continuously variable master adjustment device such as a resistor or potentiometer RP1, RP2 allows adjustment of the level of amplification on each channel. The variable master adjustment device provides the user the advantage of being able to preset the maximum voltage presented to the input of the volume controls. This prevents an inexperienced volume control operator from driving the remote amplifier or the speakers into distortion or damaging the volume control or speakers. The variable master adjustment device also allows the volume control and speaker to be grounded, i.e. shut off, if desired.

The signal conditioner’s output has four conductors which advantageously enable the system of this preferred embodiment to connect to most existing wiring systems thereby providing a system ideal for retrofitting existing outdated or inadequate systems. The four lines carry the following signals: 24 volts DC power 22, ground 12, right channel 24 in reference to ground, and left channel 26 in reference to ground. Alternatively, for mono-channel applications three conductors may be utilized to carry power, ground, and the audio signal.

For ease of manufacturing, design and operation the left channel amplification circuitry mirrors the right channel amplification circuitry and, accordingly, only the right channel amplification circuitry is described in detail herein. Furthermore, the audio amplifier of this preferred embodiment is of the type commonly used for audio signal amplification. The circuit is built around a LM1875 20 watt power audio amplifier built by National Semiconductor and is described on page 1–154 to 1–159 of the National Semiconductor application book. Advantageously, the LM1875 amplifier is a monolithic power amplifier which offers low distortion and high quality signal performance at temperatures up to 170° C. while thermal protection limits return operation to 150° C. The LM1875 offers up to 30 watts of power output with distortion levels of generally less than 0.015% total harmonic distortion (THD) at 1 Khz at 20 watts and is extremely stable at gains of 5 or greater. The gain of the amplifier is preferably between about 5 and 20 and most preferably between about 7 and 13. Of course, other semiconductor amplifiers may be used in place of the LM1875, including, but not limited to, integrated circuit known as the TDA2040, TDA7262, or TDA2614 available from Thomson Electronics.

As known by those of ordinary skill in the art, adequate heat dissipation helps maintain amplifier longevity and performance. The National Semiconductor application book provides detailed information regarding heat dissipation and proper heat sinking of the amplifier components.

The right channel audio signal from the audio source 6 enters the signal conditioner 14 at the right channel connector 8 having reference to ground 12. Preferably the connector is a standard RCA plug which is commonly used in audio applications. Of course, a plethora of suitable electrical and optical connectors exist and may be used to enjoy the advantages of the invention herein disclosed. Although RCA connectors are mentioned explicitly the invention should in no way be limited to connectors of any one type. Thus, it is contemplated that the use of any suitable audio-quality connectors, such as spade terminals, are within the inventive scope of this application.

It is also envisioned that the signal from the audio source could be configured as a balanced output, if desired. Balanced output eliminates undesirable noise in the audio signal. A typical balanced output comprises three lines, consisting of a positive terminal, a negative terminal and ground. A balanced signal is often carried over a three conductor cable comprising a twisted pair and ground for each channel. Three pin connectors are used to connect a balanced output to an input circuit. Thus, in a mono-channel application, the balanced output would require four conductors and a stereo application would require six conductors (two for right channel, two for left channel, ground and power). Those of ordinary skill in the art are familiar with balanced outputs and, accordingly, they are not discussed in great detail herein. Other electrical connectors exist and can easily be adapted for use with the present invention, as desired, such as pin connectors, terminal strips and the like.

Connected to the right channel connector 8 is a 1 kΩ resistor R2 which feeds into a 50 kΩ variable resistor potentiometer RP2. As is known by those of ordinary skill in the art, the variable resistor is preferably configured as a voltage divider in both the signal conditioner 14 and the volume control 20 (described later). The variable resistor RP2 is user variable between a series resistance of about 0 to 1000 kΩs, more preferably between about 0 and 100 Ωs and most preferably between about 0 and 50 kΩs and provides for adjustment of the signal voltage level to a input A1 of the amplifier 102. The signal is applied to the terminal of amplifier 102 through a series connected 1 kΩ resistor R4 and a 1.0 uF capacitor C2.

The positive side of the capacitor C2 connects in parallel with the positive side of a 100 pF capacitor C4, a 22 kΩ resistor R6 and the positive input A1 of the amplifier 102. The negative side of the capacitor C4 connects to ground. The capacitor C4 and the capacitor C2 work in unison to form a band-pass filter for the amplifier 102 thereby allowing only a certain range of frequencies to the amplifier. The capacitor C2 blocks any low frequency or direct current (DC) from entering the amplifier 102. Capacitor C4 provides a short circuit path for high frequency noise or signals. The 22 kΩ resistor R6 in turn connects in parallel with a 1.5 kΩ resistor R15, a 10 uF capacitor C13 and a 1N52429 zener diode D2. The zener diode D2 biases the amplifier 102 so that the output voltage may swing from +12 volts to −12 volts. A resistor R15, preferably 1.5 KΩ, is connected to power supply node 104. Current flow is controlled by a 1N4004 diode D1 connected to a one-half (½) amp fuse 106. The fuse prevents greater than a predetermined current flow from entering the circuitry of the signal conditioner 14 and causing damage thereto. The fuse 106 connects to a terminal accepting power via the power line 18 from the power supply 16 (see FIG. 1). The diode D1 protects the circuitry by preventing current from flowing backwards through the circuit should the power input inadvertently be hooked up positive input to ground.

Preferably, a 1000 uF capacitor C14 is connected between the supply rail 104 and ground 12. As is known by the those skilled in the art, the capacitor C14 will act as an open circuit to DC current but allow AC signals to pass freely. Thus this design further reduces noise in the system of the present invention by allowing high frequency signals on the power supply node 104 to freely flow to ground 12. Furthermore, the capacitor C14 acts as a power storage device should the power at node 104 momentarily sag.

The signal at the positive amplifier input A1 is reproduced or replicated at the amplifier output A4 having gain determined by the user controlled variable resistor RP2 and is inverted in relation to the signal of the amplifier input A1. The negative amplifier input A2 connects in parallel with a 22 kΩ resistor R10 which in turn feeds back to the amplifier output A4 through resistor R10. This connection provides negative feedback to reduce the gain and increase the fidelity of the amplifier. The negative amplifier input A2 also connects to ground through a 1 kΩ resistor R8 in series with a 47 uF capacitor C6. The amplifier 102 also has DC power supply voltages applied across terminals A3 and A5. These are known by those of ordinary skill in the art as "rail voltages" and are constant power supply voltages needed to operate the amplifier 102. The output voltage at the amplifier output A4 must remain between the voltage at the terminals A3 and A5. Terminal A5 is connected to the power supply rail 104 and is also referenced to ground through a 0.1 uF capacitor C8. The capacitor C8 shorts high frequency noise to prevent it from interfering with the operation of the amplifier 102. Amplifier terminal A3 connects directly to ground.

The amplifier output A4 connects to a resistor-capacitor network comprising a 0.1 uF capacitor C10, 4.7Ω resistor R12, and 1000 uF capacitor C12, and resistor R14. The resistor-capacitor network provides high frequency stability and prevents parasitic oscillation. The capacitor C12 blocks any DC signal from the output while the capacitor C10 acts as a short to ground for high frequencies. The opposite side of the capacitor C12 connects in parallel with a 1 kΩ resistor R14 and the output terminal for the right channel output 24. Terminating the audio signal line 24 through a connection to ground through R14 provides DC residual bleed off of voltage produced by the output of the amplifier 102.

The amplifier output A4, provides the right channel signal to the signal output terminal 24 and to a plurality of output connector blocks 100, as shown in FIG. 1. One or more output blocks 100 may be connected to one or more volume controls 20 (FIG. 1) as desired. Each connector block 100 also provides a power terminal 22, left channel signal terminal 26, and a ground terminal 12 as shown. A four conductor line connects to each connector block 100 to carry the audio signal, and power, to each volume control 20. Advantageously, four conductors are utilized to power traditional speaker pairs, i.e. two conductors for each speaker, thereby making the four conductor configuration of the system of the present invention ideal for retrofit applications.

As noted above, the system of the present invention may also be configured to operate without the signal conditioner 14 or other amplifier by connecting the audio source 6 (FIG. 1) and power supply 16 (FIG. 1) directly to the volume control 20 (FIG. 1).

The operation and connections for the left channel amplifier circuitry essentially mirrors the operation and connections for the right channel amplifier described herein and, therefore, this description will not be repeated.

Volume Control Circuitry

Figure 4A:
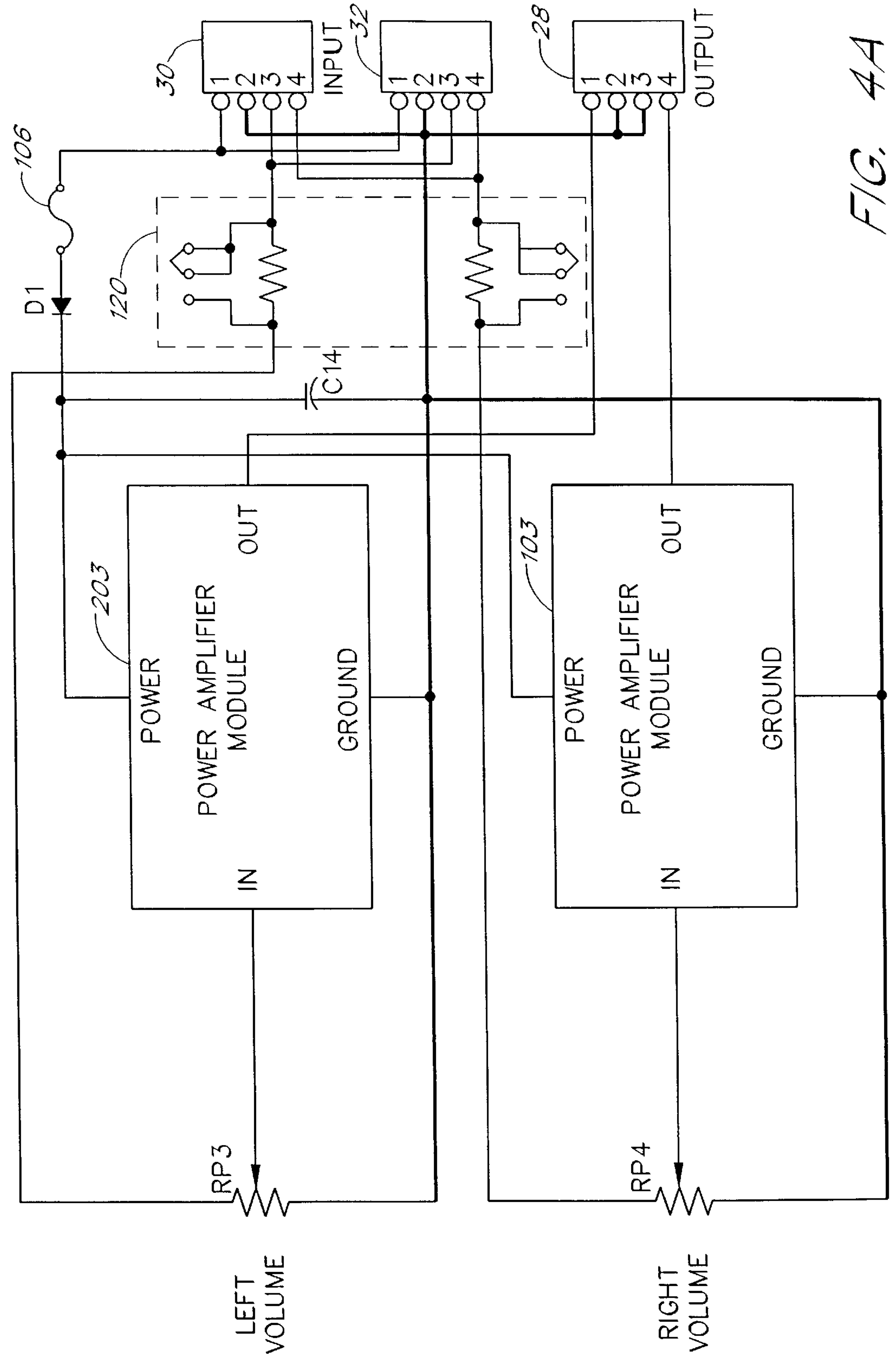
FIG. 4A is a diagram of a powered volume control configured for stereo operation and having features of the present invention.

As noted above in connection with FIG. 1, the output terminals of the signal conditioner 14 connect via wires or some other form of signal conductor to the input connector block 30 of one or more volume controls 20. FIG. 4A illustrates a basic block diagram of one possible embodiment of the circuitry for a volume control 20. The signal enters the volume control 20 through the input connector block 30 which in turn connects to an input attenuator 120. The attenuator decreases the voltage swing of the input signal. The signal is then further divided by a variable resistor RP4. Accordingly, the left channel signal is also divided by a variable resistor RP3. The voltage divided right channel signal then enters the volume control amplifier 103, which preferably has a constant gain. Thus, the variable resistor RP4 determines the magnitude of the signal presented to the constant gain amplifier 103. The resistance of the variable resistor RP4 is between about 0 to 1000 kΩs, more preferably between about 0 and 100 kΩs and most preferably between about 0 and 50 kΩs. The amplified signal is then provided to the left speaker 44 through the speaker connector block 28.

Power to the circuit is provided through the input connector block 30. A power line from the connector block 30 connects to a fuse 108 and then to a diode D1 before connecting to the volume control amplifiers 103, 203. The supply rail is referenced to ground through a capacitor C14 thereby shorting any high frequency noise on the supply rail. The capacitor C14 also acts as a power storage device should the power at node 104 momentarily sag. The volume control also comprises an output connector block 32 connected electrically to the input connector block 30 so that a plurality of volume controls may be configured in a daisy chain arrangement, as will be explained in more detail later.

Figure 4B:
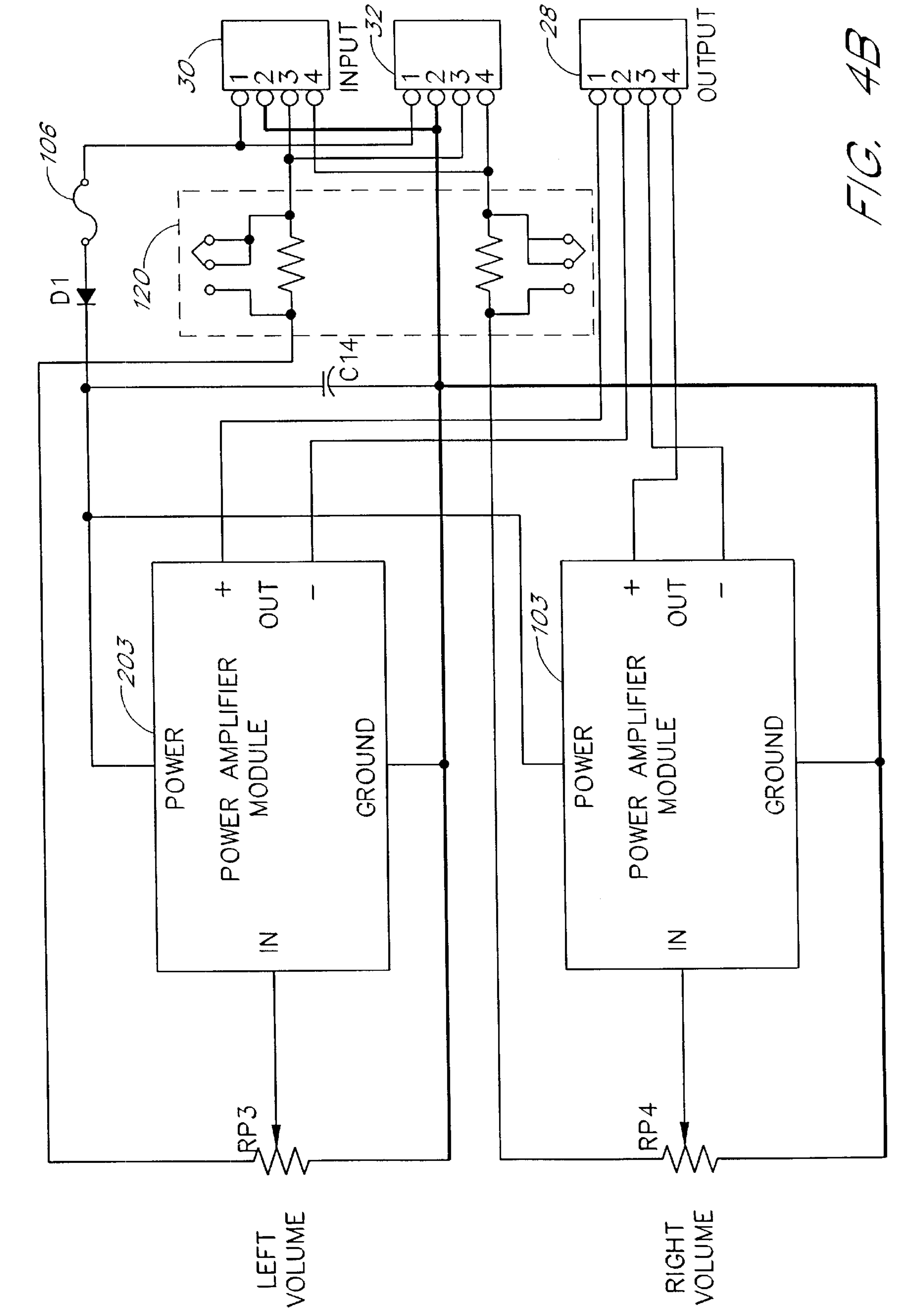
FIG. 4B is a diagram of a powered volume control configured for bridged high-power stereo operation and having features of the present invention.

The circuitry of the volume control 20 may be configured to operate in a bridged or single channel mode. FIG. 4B illustrates a volume control 20 configured in bridged mode. In bridged mode, the volume control 20 supplies power to left and right speakers 42, 44, (FIG. 1). The connections to the input connector block 30 and to the speaker connector block 28 may be varied, as desired, to achieve other stereopower output and mono-channel output configurations.

Figure 4C:
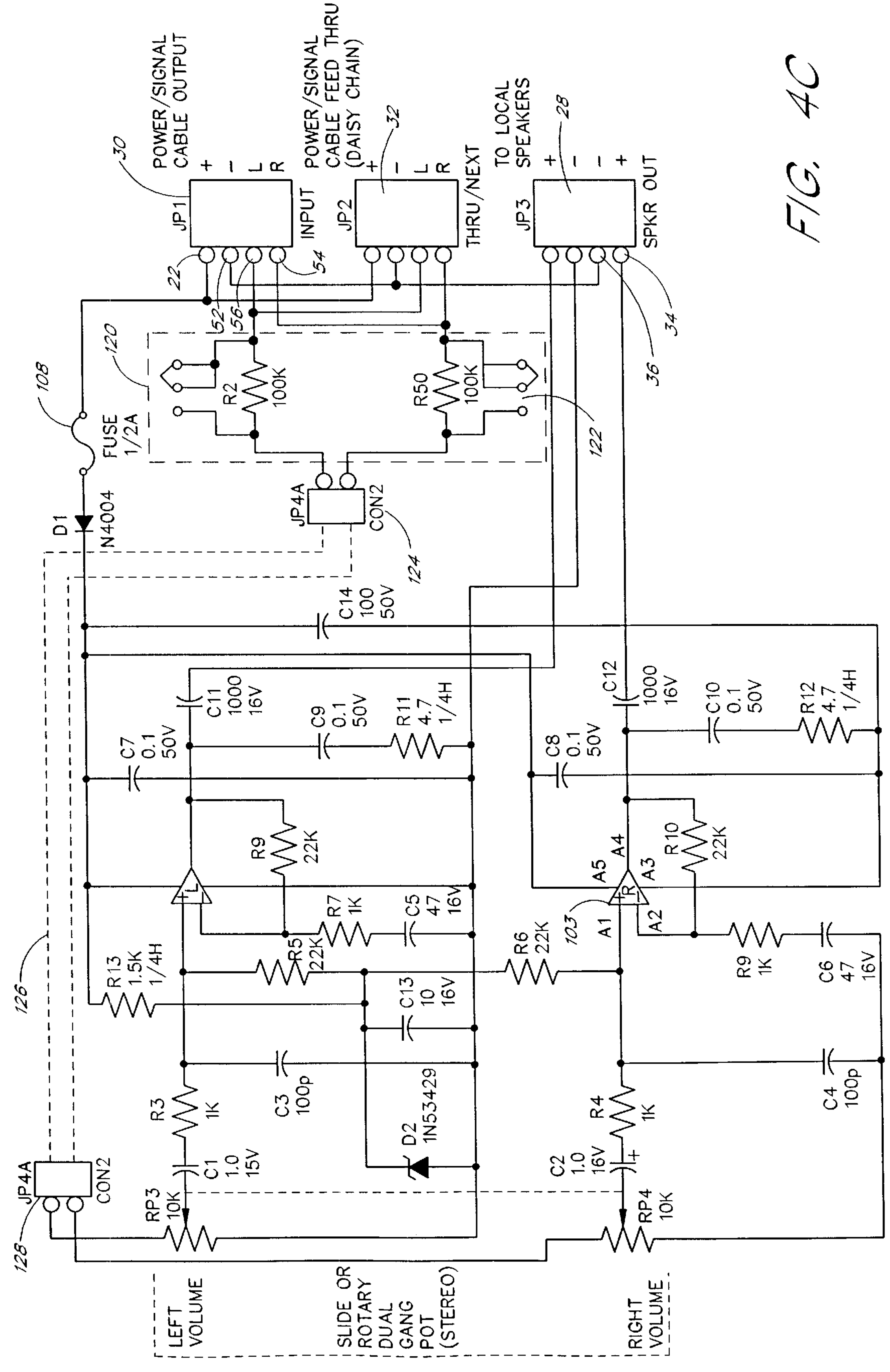
FIG. 4C is an electrical schematic diagram of a 7.5 watt per-channel powered volume control having features of the present invention.

FIG. 4C illustrates the internal componentry of one preferred embodiment of a volume control 20, configured for stereo audio amplification. The circuitry of the volume control 14 generally resembles the circuitry of the signal conditioner 14. The four conductor wires from the signal conditioner 14 connect at the input connector block 30. The terminals of the input connector block 30 are each daisy chained directly to the corresponding terminals of the output connector block 32 to facilitate connection of additional volume controls 20 in a daisy chain fashion, as described below in more detail.

The power terminal 22 also connects to a ½ amp fuse 108 as in the circuitry of the signal conditioner 14. Power is supplied to the circuit in the same fashion described above for the signal conditioner 14. The ground terminal 52 also connects to a circuit ground 12. The left channel amplification circuitry also mirrors the right channel amplification circuitry in the volume control 20. Thus, in the interest of brevity only the differences in the right channel circuitry of the volume control 20 in comparison to the right channel circuitry of the signal conditioner 14 are described herein.

The right channel input terminal 54 connects to attenuator circuitry shown as 120. The attenuator comprises a 100 kΩ resistor R50 in series in with the input signal. Alternatively, an attenuator bypass switch 122, in parallel with the resistor R50, provides means for bypassing the attenuator to maintain the signal at its fullest magnitude. Thus, depending on the position of the switch 122, the 100 kΩ resistor R50 may be bypassed with a short or placed in series with the input signal. For example, if the volume control 20 were to be directly connected to a line level source (unamplified), the resistor R50 may be bypassed via switch 122 so as to not decrease the signal strength to too low a level.

Figure 6A:
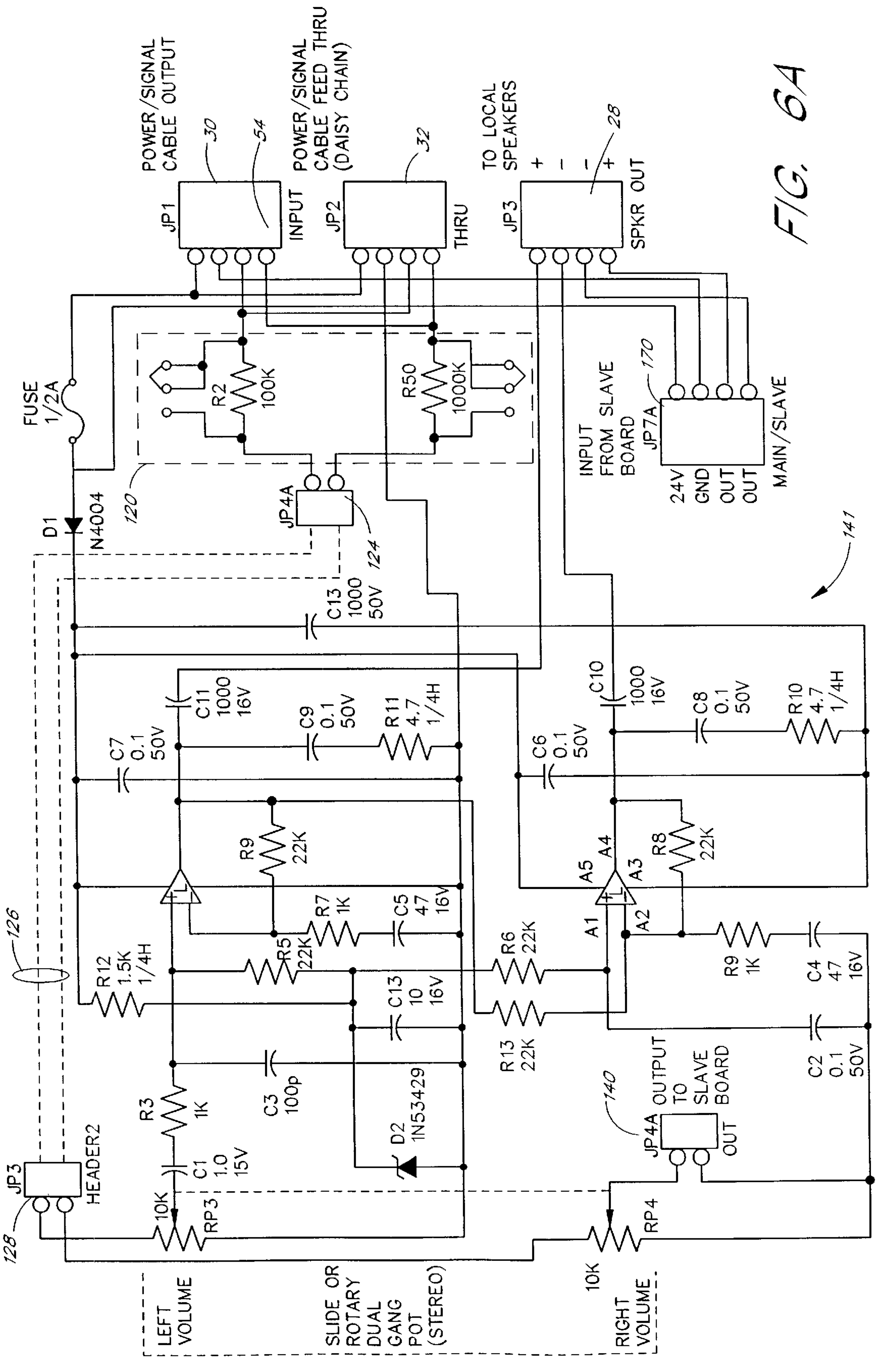
FIG. 6A is an electrical schematic diagram of a master circuit card of a powered volume control having 15 watts of power amplification per channel.

A jumper 124 connects opposite the attenuator 120 to a ribbon wire 126. The ribbon wire connects at the front of the board to an input jumper 128. The input jumper 128 connects to a 10 kΩ variable resistor RP4. The 10 kΩ resistor RP4 adjusts the magnitude of the signal presented to the right channel amplifier circuitry thereby controlling the magnitude of the signal exiting the volume control 20 and the volume of the sound at the right speaker 42. The variable resistor RP4 is controlled by a user adjustable device such as the rotatable stem 86 shown on FIG. 2. Moving to FIG. 6B, the same circuitry described above for the signal conditioner 14 connects to resistor RP4. It is an advantage of the present invention that both the variable resistors which control right and left channel power amplification, i.e. volume, are located on the master board 141, as shown in FIG. 6A, which decreases manufacturing costs and increases reliability. As shown in FIG. 4C, a single control, dual track potentiometer controls the right channel variable resistor and the left channel variable resistor in unison. Alternatively, separate controls for each of the right and left channel could be provided to achieve balance control between the right and left channel.

The left channel output connects to the speaker connector block 28 through 1000 uF capacitor C12. The right channel line connects to the right channel speaker output terminal 34. Ground 12 connects to the right channel ground terminal 36. The right speaker 42 connects to the output connector block 28 via a two conductor right speaker line 48 as shown in FIG. 1.

System Operation

Figure 5A:
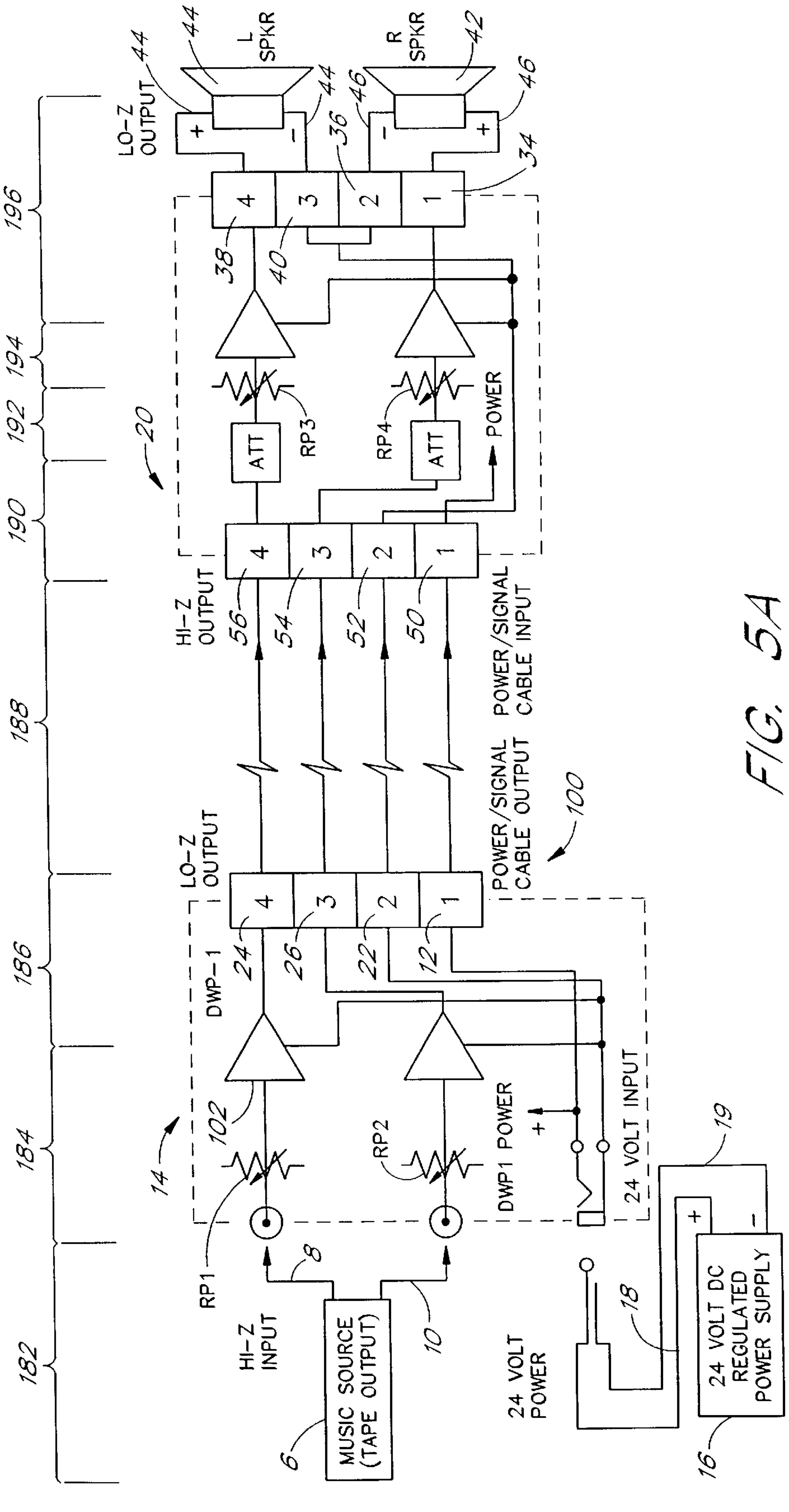
FIG. 5A is a block diagram of a multiple speaker audio system incorporating a signal conditioner and a volume control and having features of the present invention.
Figure 5B:
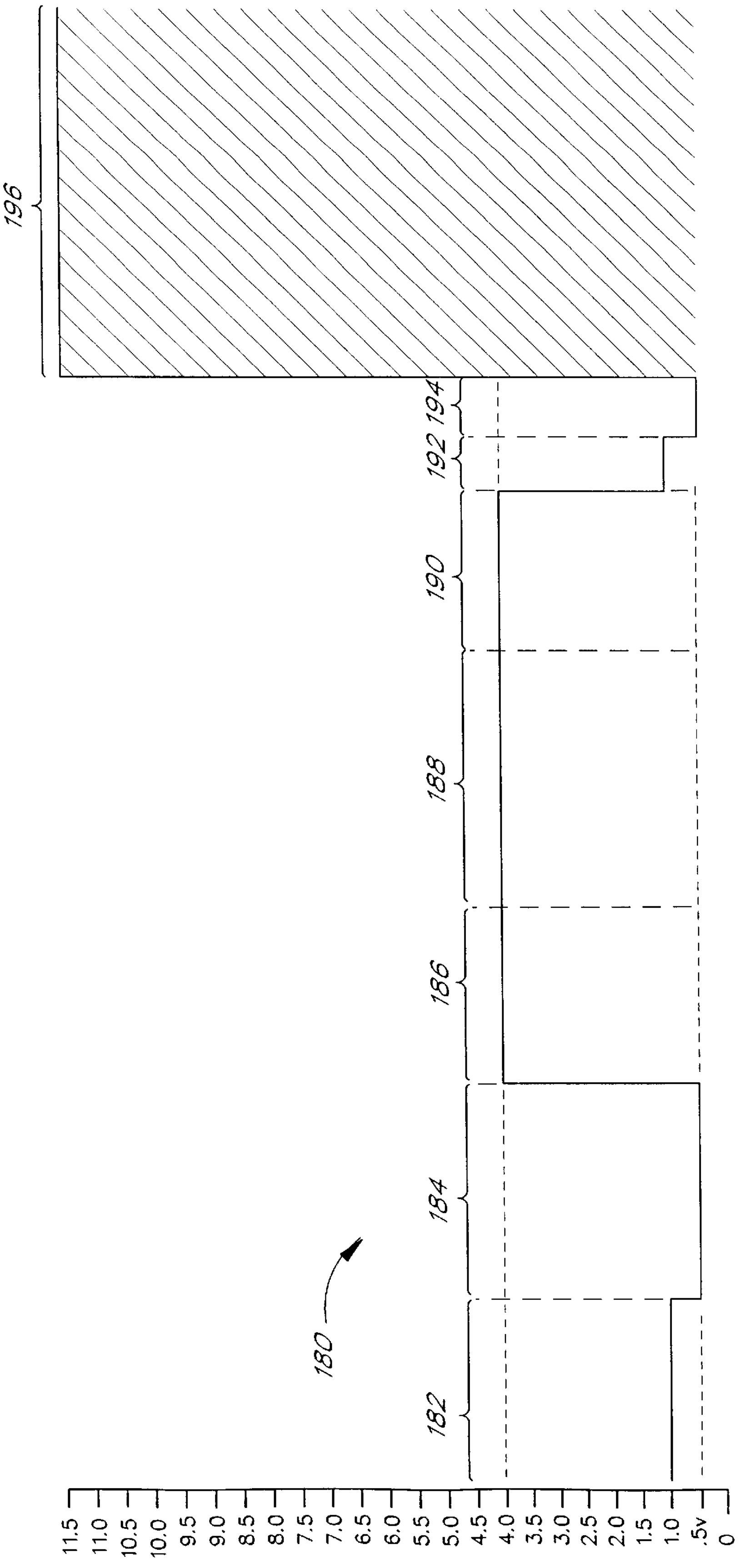
FIG. 5B is graph illustrating relative signal amplitude in relation to the block diagram of FIG. 5A.

FIG. 5A is a schematic block diagram of the powered volume control described above. FIG. 5B shows corresponding relative signal voltage levels which occur during typical operation of this preferred embodiment. To operate the system, the audio source 6 (in this case a tape output) and the power supply 16 must first be energized thereby enabling the power supply to provide current to the signal conditioner 14 and the volume control 20. The audio source 6 provides an audio signal at a voltage level commonly known as "tape out" level. The tape out level is a common output voltage level in the audio industry and most audio equipment is capable of producing a signal at a tape out level. The level of the signal from the audio source 6 is approximately 1 volt AC as shown at section 182 of the signal voltage graph 180. Note that the graph 180 shows the relative, not actual voltage level, of the audio signal at each section within the system.

From the audio signal source 6, the signal travels via a right channel line 8 and a left channel line 10 to the input of the signal conditioner 14. Alternatively, the system could be configured in a mono-channel configuration thereby providing an identical audio signal on both the right and left channel or a single channel having greater power. Advantageously, the input of the signal conditioner 14 presents a high input impedance, generally greater than about 1 kΩs, which prevents the signal conditioner from distorting the output of the audio source 6 and excessively loading the audio source output voltage. More preferably, the input impedance of the signal conditioner 14 is between about 1 kΩ and 100 kΩ and most preferably greater than about 1000 kΩ. Upon entering the signal conditioner 14 the signal passes through the variable resistor RP2 (FIG. 3) which generally creates a voltage drop in the signal to about 0.5 VDC as shown at section 184. The variable resistor RP2 is selectably controllable to alter the degree of attenuation in the signal shown at section 184. Adjusting the resistance of RP2 adjusts the amplitude of the signal. Thus, an operator may adjust the level of the audio signal at node 184 controlling the right and left channel variable resistors or other adjustment device, such as a potentiometer, variable resistor, rheostat, trimpot, or digital resistor network. Such control advantageously provides means to prevent the volume control 20 from receiving a signal from the signal conditioner 14 which would damage the volume control or the speakers.

The signal next enters the amplifier 102. The gain of the amplifiers of the signal conditioner 14 and the volume control 20 are generally constant and thus the power of the signal exiting the amplifier is determined by the magnitude of the signal entering the amplifier.

The amplified audio signal is shown in FIG. 5B as an amplified signal at section 186. Upon exiting the amplifier the amplified signal is provided at terminal 24 on the signal output block 100. The signal exiting the signal conditioner 14 is fairly robust and advantageously is prepared for transmission at the higher voltage amplitude which aids the signal in resisting interference and provides sufficient magnitude for transmission to a distant volume control 20. Preferably, the amplitude of the output signal from the amplifier 102 swings in the range from about plus/minus 4 to 5 volts in reference to ground, although other biasing ranges may be suitable such as ±1–3 volts or up to ±30–50 volts or more. Because the output voltage of the signal conditioner at section 186 is fairly robust, the millivoltage noise it may pick up creates less overall distortion than a signal at a tape out voltage level which may swing less than about ±1 volt. Thus, the present invention creates a conditioned audio input signal which, because of its increased magnitude, is more resistant to the effects of noise and provides a more robust signal to facilitate transmission over extended distances. Further, the low output impedance of the signal conditioner 14 allows for more voltage to be dropped across devices connected thereto, such as the volume control 20. The signal conditioner has output impedance of less than about 100Ω, more preferably less than about 1Ω, even more preferably less than about 0.01Ω, and most preferably less than about 0.001Ω. Four conductors or wires, which carry the right and left channel signals, ground, and power, link the signal conditioner 14 to each of one or more volume controls 20. The amplitude of the amplified audio signal between the signal conditioner 14 and the volume control 20 is shown at section 188 on the relative signal graph 180.

The volume control 20 connects to each conductor from the signal conditioner 14. The volume control 20 displays a high input impedance which thereby allows a plurality of volume controls to be connected to a single signal conditioner 14 without overloading. The input impedance of the volume control 20 is preferably greater than about 1 kΩ, more preferably between about 1 kΩ and 1000 kΩ and most preferably greater than about 1000 kΩ. The input impedance of the particular preferred embodiment described herein is about 100 kΩ. This is a significant advantage over prior art systems which are limited in the number of additional speakers that can be connected to a single amplifier because each additional speaker, having an impedance of anywhere from 4 to 8Ωs, would combine in parallel thereby incrementally loading the amplifier with a lower and lower impedance. Advantageously, a single signal conditioner 14, in conjunction with adequate power from one or more power supplies 16, can serve up to a hundred or more powered volume controls 20. Additional power sources may be provided as needed, to supply additional volume controls. Such power sources may be separated or may be incorporated in the powered volume control(s), as desired.

The signal at section 188 enters the volume control 20 through terminals 50, 52, 54, 56 at section 190. This signal is attenuated by attenuator 120 which decreases the amplitude of the incoming signal at section 192 to about 1 volt thereby insuring that the amplifier 103 of the volume control 20 is not driven into clipping mode or does not suffer permanent damage. The attenuated signal at section 192 is provided across the variable resistor RP4 having resistance selectably controlled by the user of the volume control 20. The operation of the volume control allows the operator to adjust the position of variable resistor RP4 to alter the resistance presented to the incoming signal which in turn controls the signal presented to the volume control amplifiers at section 194 and the sound volume provided by the speakers 42, 44.

After the magnitude of the incoming signal is adjusted to a relative voltage of about 0.5 volts (depending on the desired voltage output level) at section 194, the signal enters the amplification circuitry of the volume control 20, shown in FIG. 4C. The volume control 20 has an amplifier 103 to increase the magnitude and/or power of the signal provided to the right channel output terminal 54. From the right channel output terminal 54 the right channel signal travels to the right speaker 42. From the left channel output terminal 56 the left channel signal travels to the left speaker 44. As shown in the circuitry (FIG. 5A) and the shaded section 196 (FIG. 5B), the power of the signal at the output terminal 54 may be adjusted using the variable resistor knob 88 (FIG. 2) to control the volume at the speaker 42. Since the volume is user adjustable, the signal voltage may swing from 0 volts to about +/−11 volts, referenced to ground. Of course, using different circuitry and biasing voltages, the output voltage may range from 0 volts to +/−50 volts. Further, as known by those of ordinary skill in the art, the voltage output of the volume control 20 is also a function of the resistance of the load attached thereto.

Advantageously, the volume control 20 displays a low output impedance thereby making the volume control 20 appear as a substantially ideal power source to each speaker.

The volume control 20 preferably has an output impedance of less than about 100Ω, more preferably less than about 1Ω and even more preferably less than about 0.01Ω and most preferably less then 0.001Ω. It is contemplated that a number of various speaker types could be used with this system and although this preferred embodiment discloses connecting a single pair, modifications could easily be made to the circuitry disclosed herein to facilitate connecting additional speakers, if desired.

The amplification levels of the signal conditioner 14 and the volume control 20, determined by the variable resistors RP2, RP4, are preferably adjusted by a user so that the signal conditioner provides the volume control with a signal magnitude such that when the volume control variable resistor RP4 is set for maximum amplification (volume) the volume control amplifier 103 is safely below power levels which could result in clipping and distortion or damage to the volume control or speakers. The signal conditioner 14 thus sets the maximum level and prevents the volume control from being improperly adjusted to provide distorted audio output or causing damaging electrical or mechanical overload.

Preferably, the volume control 20 provides 7.5 watts per channel RMS at 0.2% THD with a frequency response of 20Hz–20KHz. The volume control 20 may accept a signal input at line level, at the adjustable level from the signal conditioner 14, or at a higher magnitude, if an attenuator is incorporated, from the output of a power amplifier.

Optional High Power Volume Control

In an alternative embodiment the volume control 20 can be configured to output 15 watts per channel. Although the overall configuration and operation of this alternative preferred embodiment are generally the same as for the lower power version of the volume control described above, some salient differences exist and are described herein.

Two primary electrical hardware differences exist between the low power 7.5 watt version described above and the 15 watt high power version. To achieve 15 watts of power amplification another circuit board, called a slave board, is utilized having generally similar circuitry as in the main board. When the slave board is added to the system of the low power volume control, it may be necessary to fit the system within a double gang or multi-gang box instead of a single gang box. Alternatively, the high power version or the low power version could be configured to fit within enclosures of various sizes and shapes, including single gang wall boxes. Again, while the preferred embodiment described herein may be contained within or mounted to a wall, other mounting configurations and locations exist and may be used while still enjoying the benefits and advantages at the present invention as herein disclosed.

As shown in FIG. 6A, the connector blocks 28, 30, 32 are identical to the 15 watt embodiment shown in FIG. 4C. Connected to the input terminal 54 is the attenuator 120 which in turn connects to the jumper 124 having ribbon cable 126 leading to the input jumper 128. The 10 kΩ variable resistor RP4 connects to the input jumper 128. However, the output of the variable resistor RP4 in the high power embodiment is different from the circuitry of the 7.5 watt low power embodiment in that it links to a master board to slave board jumper 140. A ribbon wire connects to the jumper 140 thereby carrying the signal via ribbon cable to the slave board input 144 on the slave board 142 (FIG. 6B).

Figure 6B:
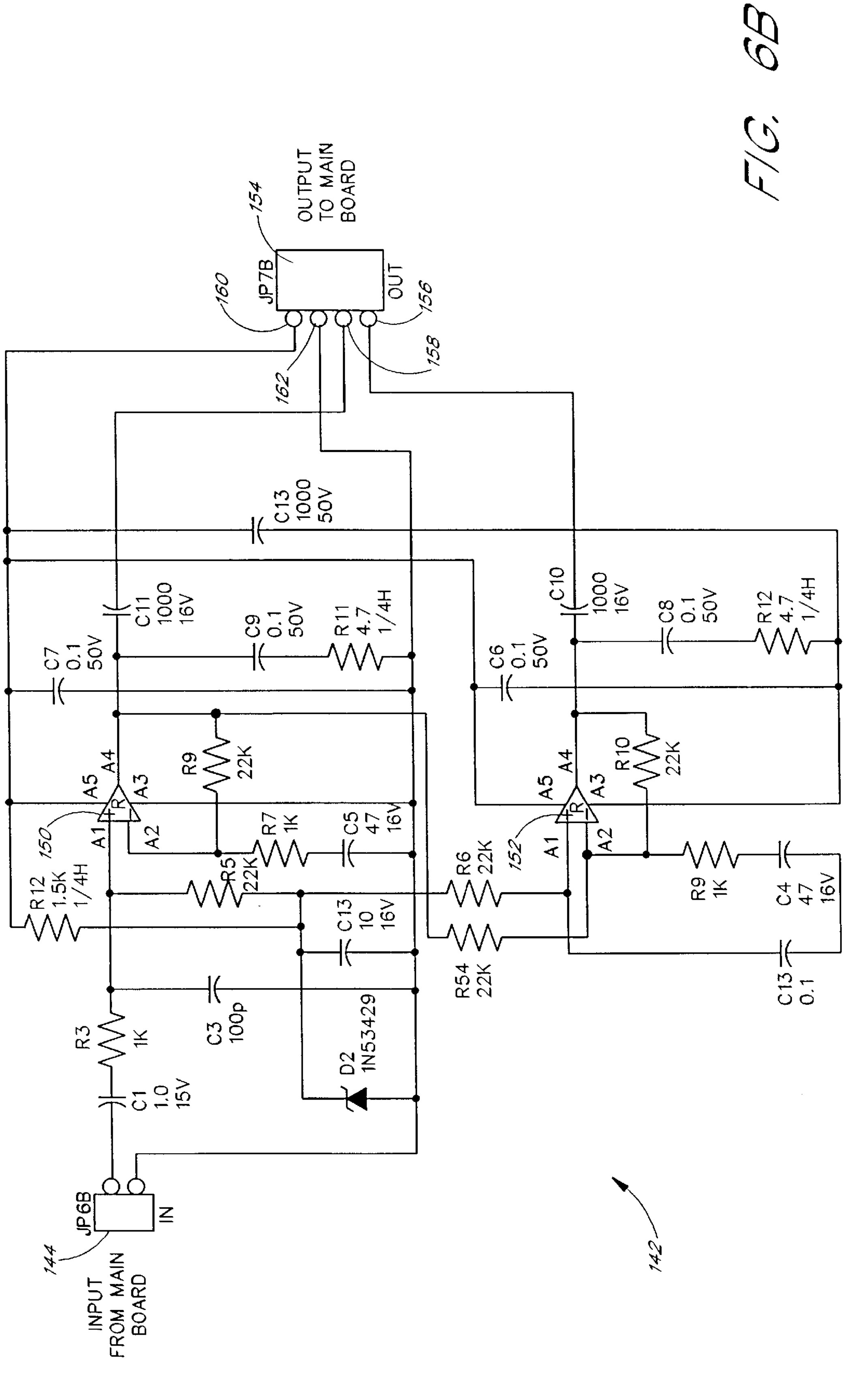
FIG. 6B is an electrical schematic diagram of a slave circuit card of a powered volume control having 15 watts of power per channel.

FIG. 6B illustrates the preferred componentry and configuration of the slave board 142. From the slave board input 144 the signal enters circuitry that is generally identical to the circuitry of the 7.5 watt embodiment and the circuitry of the main board. To accomplish the additional power amplification two LM 1875 amplifiers are utilized per channel instead of one. Thus the slave board contains two LM 1875 amplifiers and the master board contains two LM 1875 amplifiers. To further achieve increased amplification, the output of the first slave amplifier 150 is fed into the negative input A2 of the second slave amplifier 152 through a 22 kΩ resistor R54. In addition, the positive input terminal A1 of the second slave amplifier 152 is simply connected to ground through a 0.1 uF capacitor C15. The output of the second slave amplifier 152 eventually connects to the negative terminal 156 of the slave board signal output 154. Conversely, the output of the first slave amplifier 150 eventually leads to the slave board positive output terminal. The slave board 142 achieves double amplification by operating the second slave amplifier 152 as an inverting amplifier whereby the output of the second slave amplifier is amplified and inverted in relation to the amplified output of the first slave amplifier 150.

The slave board receives power via the ribbon cable at the slave board power terminal 160. Further, ground is provided via the ribbon cable at the slave board ground terminal 162 to facilitate slave board operation. The slave board output terminal block 154 connects via ribbon cable to the slave master jumper 170 located on the master board 141. This connection provides the right channel output from the slave board 142 to the speaker connector block 28. Also provided to the speaker connector block is the output from the left channel amplifier pair located on the master board 141. As shown in FIG. 6A the master board 141 is generally identical in operation to the slave board 142. The output of the first and second master board amplifiers connect to the speaker connector block. The signal to the speakers 42, 44 is not referenced to ground, but between an amplified input signal and an amplified inverted input signal. The volume control 20 provides 7.5 watts per channel RMS at 0.2% THD with frequency response of 20–20K Hz. The volume control 20 may accept signal input at line level or at speaker level.

In yet another embodiment, the 7.5 watt configuration and the higher power 15 watt configuration may selectably be configured in a single or mono-channel bridged amplifier configuration thereby providing increased power amplification to a single channel. The mono-channel amplifier is configured by connecting the positive lead on the signal input to one channel of the amplifier and the negative lead on the signal input to the other channel of the amplifier. Thus the output is the amplified difference between the negative input and the positive input.

Series/Daisy Chain Configuration

Figure 7:
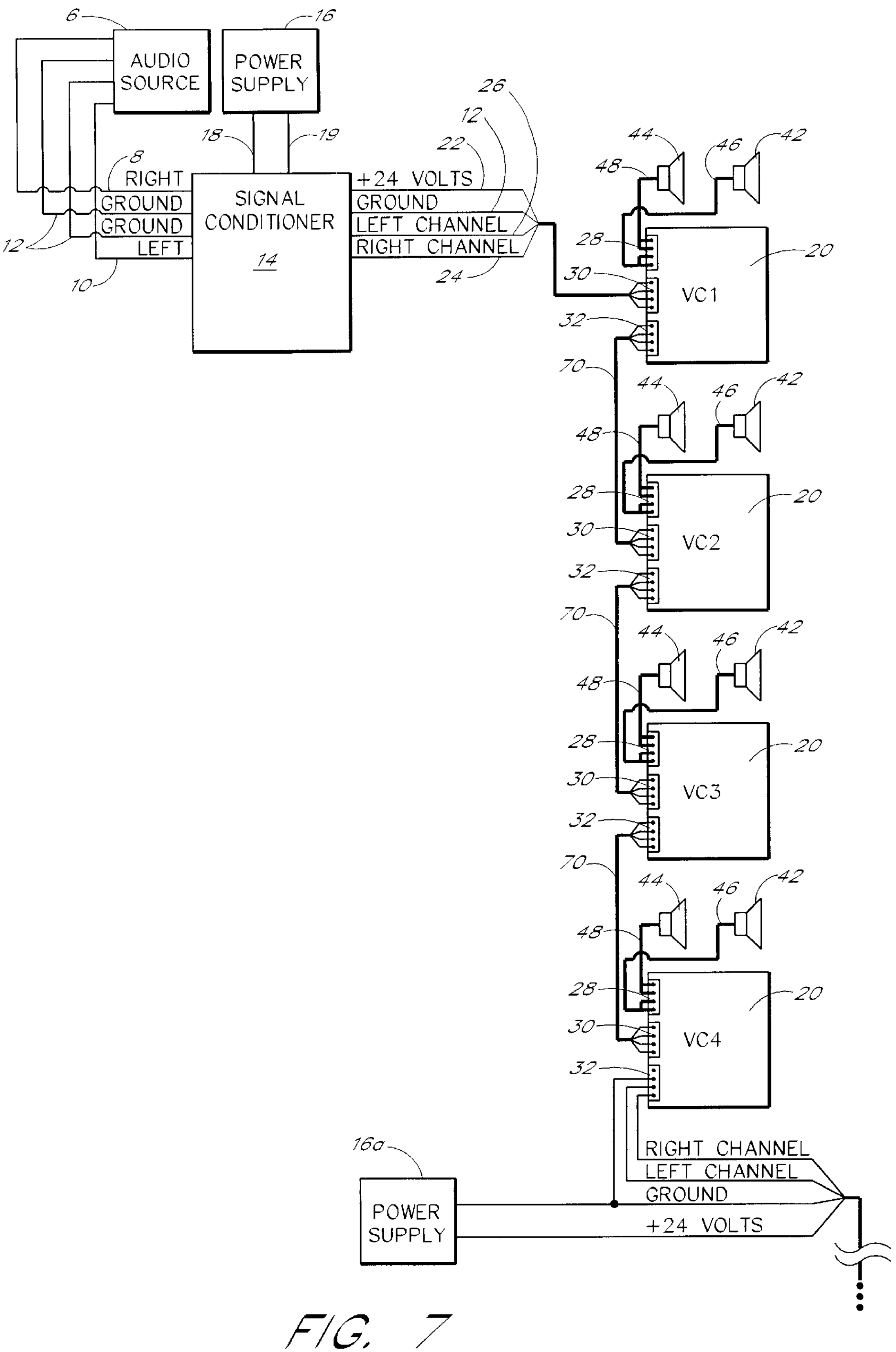
FIG. 7 is a schematic illustration of an audio system incorporating multiple powered volume controls arranged in a daisy chain configuration and having features of the present invention.

As shown in FIG. 7, the output connector block 30 of each volume control 20 preferably provides terminals to connect an additional volume control in an altemative embodiment known as a daisy chain arrangement. Advantageously, each volume control 20 provides an output connector block 30 thereby facilitating connection to the input of another volume control 20 via a four conductor line 70. Connecting the system in this manner aids installation by reducing the number of four conductor wires which much be installed in areas away from the audio source 6. In essence, a single four conductor connector line 70 links each volume control 20. The connector line 70 connects the output connector block 32 of one volume control to the input connector block 30 on the next volume control.

In the preferred embodiment, the power supply 16 is able to power from about 1 to 6 volume controls 20, and more preferably, about four. Consequently, in this preferred embodiment a supplemental power supply 16*a* may be used to supply additional volume controls with power. The supplemental power supply 16*a* connects at the power input of every fifth volume control 20. Of course, those persons skilled in the art will realize that other configurations are possible wherein greater or less than four volume controls may be powered by a single power supply 16. Alternatively, each volume control may contain its own power supply circuitry connected, for example, to a suitable 120 voltage AC source.

Optional Embodiments and Modifications

Many optional embodiments and modifications are possible to provide enhanced operation or functionality in a powered volume control or distributed audio system as disclosed herein. For example, in one optional embodiment (not shown) an additional component, known as an attenuator, may be integrated in the path of the right and left channel between a power amplifier and the signal conditioner 14 or a volume control 20. Including an attenuator facilitates connection to a power amplifier (not shown) whereby the high power signal from the power amplifier is reduced by about 30 dB. The additional attenuator, such as an OP-3 available from Sonance, Inc. of San Clemente, Calif. provides a 30 dB reduction in signal strength thereby preventing overloading signal conditioner 14 or volume control 20. Attenuators of this nature are known to those skilled in the art and, accordingly, the internal circuitry thereof are not described in detail herein.

It is also contemplated that the signal conditioner 14 or volume control 20 could connect to a powered speaker. The powered speaker contains additional amplification circuitry to further increase the amount of power provided to a speaker.

It is also contemplated that the conductors of any of the preferred embodiments described above may comprise fiber optic cable or a combination of optical and electrical conductors. Optical transmission has the advantage of immunity to electrical interference and decreased power loss as compared to common electrical conductors. Alternatively, the audio signal could be transmitted to each volume control 20 via radio or other EMF waves thereby further aiding installation.

The various embodiments described herein are also not limited to rotary or slide controls for volume of one of many associated speakers. A wide variety of other controls may also be used, such as up/down push buttons operating an electronic control, infrared control via a hand held remote infrared transmitter, digital resistive network, or an electronic capacitive touch panel. The rotary or slide potentiometer could also easily be replaced with a digital push button or numeric keypad which could be linked to a digital display to provide a visual volume level display. Such a system would have the advantage of presetting the volume to a certain level prior to an event or period. Mastering of multiple "slave" volume controls may also be accomplished using circuit techniques to provide mastered control of numerous volume controls, as desired.

Optionally, the powered volume controls for multi-speaker systems described herein may be configured to provide individual treble, bass and balance adjustments. These may be provided by simple filter networks which modify the frequency characteristics of the signal presented to the speakers. Balance adjustment may be provided by a dual variable resistor or a single variable resistor configured to distribute power between a right and left channel. Treble, bass and balance controls are known by those of ordinary skill in the art and accordingly are not discussed in great detail herein.

In yet another optional embodiment the volume control 20 may be configured to provide for integral source selection control thereby allowing an operator in a remote location to choose between a number of different audio sources. For example, a remote tuner could preferably be used to select a number of modulated or digitally multiplexed signals provided on one of the four lines presented to the volume control 20. Thus, based on the selection, various music channels could be selected, or in the case of a building wide announcement, the entire sound system could be used to provide alternate audio output to each different speaker or speaker pair in the building or area. It is also envisioned that an on/off switch could be utilized on the signal conditioner 14, or the volume control 20.

Similarly, it is contemplated that the electronics of the embodiment disclosed herein could be controlled by a computer from a central or remote location. Such a system would integrate with software which automatically controls system operation including the volume level of each volume control 20 and corresponding speaker or speakers. For example, in the quiet of morning outside entry speakers could have a low volume, but during the midday business the computer could automatically increase the volume to a louder preprogrammed volume level. To achieve such control, data ports would be provided on the signal conditioners 14 or the volume controls 20. Connecting to the data port is a data control line from the computer or electronic control. Advantageously, the data port could comprise a serial RS-232 data port to facilitate interface with personal computers. Alternatively, the data port could comprise an infrared or RF receiver or other type of data communication equipment. Internal to the signal conditioner 14 and the volume control 20 are electronics which are integrated with the amplifier electronics to control the system as desired.

Alternatively, any of the above preferred embodiments and others deriving therefrom may be installed as a mono-channel application. Mono-channel applications are well suited for shopping centers, airports, convention centers and the like. Advantageously, a paging system incorporating the claimed invention provides for selective volume control depending upon the area, the activity in the area and the ambient noise level during a particular time. For example, a convention center may need greater paging volume in certain, more noisy areas. However, in other areas or at different times in that same area lower paging volumes may be required due to reduced noise levels. The preferred embodiments described herein provide this capability.

It will be understood that the above described arrangements of apparatus and the method therefrom are merely illustrative of applications of the preferred embodiment and it is not intended to limit the scope of the invention to the particular forms set forth, but on the contrary, it is intended to cover such alternatives, modifications and equivalents as may be included within the spirit and scope of the invention as defined by a fair reading of the claims which follow.

What is claimed is:

1. A powered volume control for connecting between an audio source and one or more remote speakers, comprising:

an input circuit, adapted to be located proximate the audio source, for receiving an audio signal from said audio source for providing a preamplified signal output;

an amplifier circuit, adapted to be disposed remote from the input circuit, for receiving said preamplified signal and for providing an amplified signal output which is substantial replication of said preamplified signal and said audio signal from said audio source; an output circuit, co-located with the amplifier circuit, for providing said amplified signal output to said one or more remote speakers;

a variable adjustment device, co-located with the amplifier circuit, for allowing a user to adjust the magnitude of said preamplified signal and/or the gain or bias of said amplifier circuit such that said amplified signal output can be continuously adjusted over a predetermined range to provide volume adjustment of said one or more remote speakers; and wherein the input circuit further comprises a connector block also located proximate the audio source for receiving and outputting to the amplifier circuit the audio signal from the input circuit, for outputting the audio signal to the amplifier circuit, and for separately outputting a power supply signal to the remote amplifier circuit for powering the remote amplifier circuit.

2. The powered volume control of claim 1, wherein said input circuit comprises a plurality of terminals or connectors for providing electrical connection to said audio source.

3. The powered volume control of claim 1 comprising no more than four input terminals or connectors corresponding to right and left channel audio, power and ground whereby said volume control can be retrofitted into existing four-wire audio system installations.

4. The powered volume control of claim 1, wherein said input circuit comprises a signal conditioner/attenuator for conditioning and/or attenuating said audio signal input to provide a preamplified signal having a desired bias, magnitude, and/or range of magnitudes.

5. The powered volume control of claim 1, wherein said input circuit comprises a signal input impedance of greater than about 1 kOhms.

6. The powered volume control of claim 1, wherein said input circuit comprises a signal input impedance of between about 1 kOhms and 1000 kOhms.

7. The powered volume control of claim 1, wherein said input circuit comprises a signal input impedance of about 100 kOhms.

8. The powered volume control of claim 1, wherein said amplifier circuit comprises one or more power amplifiers.

9. The powered volume control of claim 8, wherein said amplifier circuit comprises at least one power amplifier for left channel amplification and at least one power amplifier for right channel amplification for amplifying a stereo audio signal.

10. The powered volume control of claim 8, wherein said amplifier circuit comprises two or more amplifiers adapted to be connected in singular mode for independent right and left channel amplification of a stereo audio signal or in bridge mode for increased amplification of a monophonic audio signal.

11. The powered volume control of claim 1, wherein each of said one or more power amplifiers has a stable gain of at least about 5 to 20 with less than about 0.03% total harmonic distortion.

12. The powered volume control of claim 11, wherein each of said one or more power amplifiers has a stable gain of at least about 10 with less than about 0.015% total harmonic distortion at 1 kHz.

13. The powered volume control of claim 1, wherein said output circuit comprises terminals or connectors electrically connecting to right and left channel speakers.

14. The powered volume control of claim 1, wherein said output circuit comprises a bandpass filter network configured to substantially pass signals in the audio frequency range and to substantially block DC signals and signals outside of the audio frequency range.

15. The powered volume control of claim 1, wherein said output circuit comprises a signal output impedance of less than 100 Ohms.

16. The powered volume control of claim 1, wherein said output circuit comprises a signal output impedance of between about 0.1 and 1 Ohms.

17. The powered volume control of claim 1, wherein said output circuit comprises a signal output impedance of about 0.01 Ohms.

18. The powered volume control of claim 1, wherein said variable adjustment device comprises a user adjustable variable impedance device.

19. The powered volume control of claim 18, wherein said variable adjustment device comprises a user adjustable potentiometer.

20. The powered volume control of claim 19, wherein said potentiometer comprises a rotary potentiometer.

21. The powered volume control of claim 19, wherein said potentiometer comprises a linear slide potentiometer.

22. The powered volume control of claim 19, wherein said potentiometer comprises a dual element potentiometer having one element for adjusting left channel amplification and one element for adjusting right channel amplification.

23. The powered volume control of claim 19, wherein said potentiometer comprises a digital potentiometer.

24. The powered volume control of claim 1, wherein said variable adjustment device comprises one or more actuators for selectively incrementing and decrementing said amplified signal output.

25. The powered volume control of claim 1, wherein said variable adjustment device comprises one or more data ports for receiving volume adjustment instructions or information from one or more remote sources.

26. The powered volume control of claim 25, wherein at least one of said data ports comprises an infrared or RF receiver for receiving volume adjustment instructions or information from a remote infrared or RF transmitter.

27. The powered volume control of claim 1, wherein said variable adjustment device comprises a multiple-position switch or binary encoded actuator for selecting discrete amplified signal output levels.

28. The powered volume control of claim 1, further comprising a housing for enclosing said circuit elements and for allowing access to said variable adjustment device.

29. The powered volume control of claim 28, wherein said housing is sized and configured to fit within a single-gang electrical wall box and wherein said variable adjustment device is accessible through a faceplate.

30. The powered volume control of claim 28, wherein said housing is sized and configured to fit within a multi-gang electrical wall box and wherein said variable adjustment device is accessible through a faceplate.

31. The powered volume control of claim 1, further comprising pass-through or parallel terminals or connectors for connecting to additional powered volume controls in a daisy chain configuration.

32. The powered volume control of claim 1 in combination with a signal conditioner for connecting intermediate said powered volume control and said audio source, said signal conditioner comprising circuitry for amplifying, attenuating and/or biasing said audio signal to provide on an output terminal or connector thereof a conditioned audio input signal to said volume control.

33. The combination of claim 32 wherein said signal conditioner further comprises circuitry for grounding said output terminal or connector so as to attenuate or eliminate low-frequency interference from adjacent AC power lines.

34. The combination of claim 32 wherein said signal conditioner further comprises circuitry for regulating and/or distributing power to said powered volume control.

35. The combination of claim 32 wherein said signal conditioner and said powered volume control are contained within a single housing adapted to be installed in a wall or electrical wall box.

36. A wall-mounted volume control for connecting between an amplified audio signal source and one or more remote speakers for permitting localized volume adjustment of said one or more remote speakers, comprising:

an input circuit having a relatively high input signal impedance adapted to be located proximate the audio source and to receive a first amplified audio signal from said amplified audio signal source to provide an attenuated audio signal having a predetermined magnitude or range of magnitudes;

an amplifier circuit, adapted to be located remote from the input circuit, for receiving said attenuated signal and providing a second amplified output which is a substantial replication of said attenuated signal and said first amplified signal from said amplified audio signal source;

an output circuit, co-located with the amplifier circuit, having a relatively low output signal impedance for providing said second amplified signal output to said one or more remote speakers; and a variable adjustment device, co-located with the amplifier circuit, for allowing a user to adjust the magnitude of said second amplified signal whereby the volume of said one or more remote speakers can be adjusted over a predetermined range, wherein the input circuit further comprises a connector block also located proximate the audio source for receiving the attenuated audio signal from the input circuit, for outputting the audio signal to the amplifier circuit, and for separately outputting a power supply signal to the remote amplifier circuit for powering the remote amplifier circuit.

37. The wall-mounted volume control of claim 36, wherein said input circuit comprises a plurality of terminals or connectors for providing electrical connection to said amplified audio signal source.

38. The wall-mounted volume control of claim 36, wherein said input circuit comprises a signal input impedance of between about 1 kOhms and 1000 kOhms.

39. The wall-mounted volume control of claim 36, wherein said input circuit comprises a signal input impedance of about 100 kOhms.

40. The wall-mounted volume control of claim 36, wherein said output circuit comprises terminals or connectors for electrically connecting to said one or more remote speakers.

41. The wall-mounted volume control of claim 36, wherein said output circuit comprises a signal output impedance of between about 0.001 and 20 Ohms.

42. The wall-mounted volume control of claim 36, wherein said output circuit comprises a signal output impedance of about 0.01 Ohms.

43. The wall-mounted volume control of claim 36, wherein said variable adjustment device comprises a circuit for adjusting the gain and/or bias of said amplifier.

44. The wall-mounted volume control of claim 36, wherein said variable adjustment device comprises a circuit for adjusting the amplitude or magnitude of said attenuated signal.

45. The wall-mounted volume control of claim 36, wherein said variable adjustment device comprises a user adjustable potentiometer.

46. The wall-mounted volume control of claim 45, wherein said potentiometer comprises a rotary potentiometer.

47. The wall-mounted volume control of claim 45, wherein said potentiometer comprises a linear slide potentiometer.

48. The wall-mounted volume control of claim 45, wherein said potentiometer comprises a digital potentiometer.

49. The wall-mounted volume control of claim 45, wherein said variable adjustment device comprises one or more data ports for receiving volume adjustment instructions or information from one or more remote sources.

50. The wall-mounted volume control of claim 49, wherein at least one of said data ports comprises an infrared or RF receiver for receiving volume adjustment instructions or information from a remote infrared or RF transmitter.

51. The wall-mounted volume control of claim 36, wherein said volume control is sized and configured to fit within a single-gang electrical wall box and wherein said variable adjustment device is accessible through a faceplate.

52. The wall-mounted volume control of claim 36, wherein said volume control is sized and configured to fit within a multi-gang electrical wall box and wherein said variable adjustment device is accessible through a faceplate.

53. The wall-mounted volume control of claim 36, further comprising pass-through or parallel terminals or connectors for connecting to additional wall-mounted volume controls in a daisy chain configuration.

54. The wall-mounted volume control of claim 36, comprising no more than four input terminals or connectors corresponding to left and right channel audio, power and ground whereby said volume control can be retrofitted into existing four-wire audio system installations.

55. The wall-mounted volume control of claim 36 in combination with a signal conditioner for connecting intermediate said wall-mounted volume control and said amplified audio signal source, said signal conditioner comprising circuitry for amplifying, attenuating and/or biasing said first amplified signal to provide on an output terminal or connector thereof a conditioned audio signal to said volume control.

56. The combination of claim 55 wherein said signal conditioner further comprises circuitry for regulating and/or distributing power to said wall-mounted volume control.

57. The combination of claim 55 wherein said signal conditioner and said wall-mounted volume control are contained within a single housing adapted to be installed in a wall or electrical wall box.

58. The combination of claim 55 wherein said signal conditioner and said wall-mounted volume control are contained within separate housings.

59. A wall-mounted volume control for connecting between an amplified audio signal source and one or more speakers for permitting volume adjustment of said one or more speakers, comprising:

an input circuit, adapted to be located proximate the audio signal source and having a relatively high input signal impedance adapted to receive a first amplified audio signal from said amplified audio signal source to provide an attenuated audio signal having a predetermined magnitude or range of magnitudes;

an amplifier circuit, adapted to be wall-mounted and disposed remote fro the input circuit, for receiving said attenuated signal and providing a second amplified signal output which is a substantial replication of said attenuated signal and said first amplified signal from said amplified audio source;

an output circuit, co-located with the amplifier circuit, having a relatively low output signal impedance for providing said second amplified signal output to said one or more speakers; and variable adjustment means, co-located with the amplifier circuit, for allowing a user to adjust the magnitude of said second amplified signal whereby the volume of said one or more speakers can be adjusted over a predetermined range, wherein the input circuit further comprises a connector block also located proximate the audio source for receiving the attenuated audio signal from the input circuit, for outputting the audio signal to the amplifier circuit, and for separately outputting a power supply signal to the remote amplifier circuit for powering the remote amplifier circuit.

60. An audio distribution system for distributing an audio signal from one or more audio sources to one or more speakers located remotely from said one or more audio sources, comprising:

a first amplifier adapted to be located at or near said one or more audio signal sources for receiving an audio signal input from said one or more audio signal sources and for providing a first amplified signal output which is substantially a replication of said audio signal input;

a second amplifier adapted to be located remotely from said one or more audio signal sources and configured to be wall-mounted and electrically connected between said first amplifier and said one or more remote speakers, said second amplifier having a relatively high input signal impedance and a relatively low output signal impedance and being adapted to receive said first amplified audio signal from said first amplifier to provide an intermediate attenuated audio signal having a predetermined magnitude or range of magnitudes and being further adapted to amplify said attenuated audio signal to provide a second amplified signal which is substantial replication of said attenuated audio signal and said first amplified signal; and a variable adjustment device, co-located with the amplifier circuit, for allowing a user to adjust the magnitude of said second amplified signal whereby the volume of said one or more remote speakers can be adjusted over a predetermined range, wherein the input circuit further comprises a connector block also located proximate the audio source for receiving the audio signal from the input circuit, for outputting the audio signal to the amplifier circuit, and for separately outputting a power supply signal to the remote amplifier circuit for powering the remote amplifier circuit.

61. The system of claim 60, wherein said first amplifier comprises a stereo audio amplifier having one or more channel outputs.

62. The system of claim 60, wherein said first amplifier comprises a high-fidelity stereo audio amplifier having multiple channel outputs.

63. The system of claim 60, wherein said first amplifier is adapted to be located within between about 0 and 50 feet from said one or more audio signal sources.

64. The system of claim 60, wherein said first amplifier is adapted to be located within less than about 10 feet from said one or more audio signal sources.

65. The system of claim 60 wherein said first amplifier comprises a signal conditioner for connecting intermediate said second amplifier and said one or more audio sources, said signal conditioner comprising circuitry for amplifying, attenuating and/or biasing said audio signal to provide on an output terminal or connector thereof a conditioned audio input signal to said second amplifier.

66. The system of claim 65 wherein said signal conditioner further comprises circuitry for grounding said output terminal or connector so as to attenuate or eliminate low-frequency interference from adjacent AC power lines.

67. The system of claim 65 wherein said signal conditioner further comprises circuitry for regulating and/or distributing power to said second amplifier.

68. The system of claim 60, wherein said second amplifier comprises one or more power audio amplifiers.

69. The system of claim 68, wherein said second amplifier comprises at least one power audio amplifier for left channel amplification and at least one power audio amplifier for right channel amplification for amplifying a stereo audio signal.

70. The system of claim 68, wherein each of said one or more power audio amplifiers has a stable gain of at least about 5 to 20 with less than about 0.03% total harmonic distortion.

71. The system of claim 68, wherein each of said one or more power audio amplifiers has a stable gain of at least about 5 with less than about 0.015% total harmonic distortion at 1 kHz.

72. The system of claim 68, wherein said second amplifier comprises two or more amplifiers adapted to be connected in singular mode for independent right and left channel amplification of a stereo audio signal or in bridge mode for increased amplification of a monophonic audio signal.

73. The system of claim 60, wherein said second amplifier has a signal input impedance of greater than about 1 kOhms.

74. The system of claim 60, wherein said second amplifier has a signal input impedance of between about 1 kOhms and 1000 kOhms.

75. The system of claim 60, wherein said second amplifier has a signal input impedance of about 100 kOhms.

76. The system of claim 60, wherein said second amplifier has a signal output impedance of less than about 100 Ohms.

77. The system of claim 60, wherein said second amplifier has a signal output impedance of between about 0.001 and 10 Ohms.

78. The system of claim 60, wherein said second amplifier has a signal output impedance of about 0.01 Ohms.

79. The system of claim 60 wherein said second amplifier comprises no more than four input terminals or connectors corresponding to right and left channel audio, power and ground whereby said second amplifier can be retrofitted into existing four-wire audio system installations.

80. The system of claim 60, wherein said variable adjustment device comprises a circuit for adjusting the gain and/or bias of said second amplifier.

81. The system of claim 60, wherein said variable adjustment device comprises a circuit for adjusting the amplitude or magnitude of said attenuated signal.

82. The system of claim 60, wherein said variable adjustment device comprises a user adjustable potentiometer.

83. The system of claim 60, wherein said potentiometer comprises a rotary potentiometer.

84. The system of claim 60, wherein said potentiometer comprises a linear slide potentiometer.

85. The system of claim 60, wherein said potentiometer comprises a digital potentiometer.

86. The system of claim 60, wherein said variable adjustment device comprises one or more actuators for selectively incrementing and decrementing said second amplified signal.

87. The system of claim 60, wherein said variable adjustment device comprises one or more data ports for receiving volume adjustment instructions and/or information from one or more remote sources.

88. The system of claim 60, wherein at least one of said data ports comprises an infrared or RF receiver for receiving volume adjustment instructions or information from a remote source comprising an infrared or RF transmitter.

89. The system of claim 60, further comprising a housing for enclosing said second amplifier and for allowing access to said variable adjustment device.

90. The system of claim 89, wherein said housing is sized and configured to fit within a single-gang electrical wall box and wherein said variable adjustment device is accessible through a faceplate.

91. The system of claim 89, wherein said housing is sized and configured to fit within a multi-gang electrical wall box and wherein said variable adjustment device is accessible through a faceplate.

92. The system of claim 60, wherein said second amplifier further comprises pass-through or parallel terminals or connectors for connecting to additional amplifiers in a daisy chain configuration.

93. A method for distributing an audio signal from one or more sources to one or more speakers located remotely from said one or more audio sources, comprising the following steps:

amplifying an audio signal input from said one or more audio signal sources to provide a first amplified signal output which is substantially a replication of said audio signal input, said first amplified signal having an amplitude or magnitude such that said first amplified signal is relatively impervious to spurious noise;

transmitting said first amplified signal from a location proximate the audio signal source(s) through an elongated electrical conductor to one or more remote locations near said one or more remote speakers;

transmitting a power signal from a location proximate the audio signal source(s) through a separate elongated electrical connector to one or more remote locations near said one or more remote speakers;

passing said first amplified signal through a variable impedance at said one or more remote locations to produce an attenuated audio signal having a desired amplitude or magnitude as determined by a user variable adjustment device; and amplifying said attenuated signal with power provided by the power signal, to provide a second amplified signal and transmitting said second amplified signal along one or more electrical conductors to said one or more remote speakers;

whereby said method allows for localized speaker volume control with less noise interference and distortion than methods utilizing conventional autoformer volume controls.

94. The method of claim 93, wherein said first amplified signal has an amplitude of between about ±2.5 and ±7.5 Volts RMS.

95. The method of claim 93, wherein said first amplified signal has an amplitude of about ±4 Volts RMS.

96. The method of claim 93, wherein said first amplified signal comprises a high-fidelity stereo audio signal.

97. The method of claim 93, wherein said first amplified signal comprises a monophonic audio signal.

98. The method of claim 93, wherein said step of amplifying said audio signal input to provide a first amplified signal is conducted within between about 0 and 50 feet from said one or more audio signal sources.

99. The method of claim 93, wherein said step of amplifying said audio signal input to provide a first amplified signal is conducted within less than about 10 feet from said one or more audio signal sources.

100. The method of claim 93, wherein said steps of amplifying said audio signal input to provide a first amplified signal and said step of amplifying said attenuated signal to provide a second amplified signal are performed using one or more audio power amplifiers having a stable gain of at least about 10 with less than about 0.015% total harmonic distortion at 1 kHz.

101. The method of claim 93, wherein said variable impedance is greater than about 1 kOhms.

102. The method of claim 93, wherein said variable impedance is between about 1 kOhms and 1000 kOhms.

103. The method of claim 93, wherein said variable impedance is about 100 kOhms.

104. A powered volume control as recited in claim 1, further comprising a power supply in electrical communication with the input circuit for powering the input circuit and the remote amplifier circuit.

105. A powered volume control as recited in claim 104, wherein the input circuit and the remote amplifier circuit are each connected to a power/signal cable operative to communicate the preamplified signal and the power supply signal from the input circuit to the remote amplifier circuit.

106. A powered volume control as recited in claim 105, wherein all power for the remote amplifier circuit is derived from the input circuit via the power/signal cable.

107. A powered volume control as recited in claim 1, wherein the audio signal is a line-level signal.

108. A powered volume control as recited in claim 1, wherein the audio signal is a tape-out signal.

109. A powered volume control as recited in claim 1, wherein the preamplified signal is amplified to a level between line-level and speaker level.

110. A powered volume control as recited in claim 1, wherein the preamplified signal is approximately 4 volts.

111. A powered volume control as recited in claim 110, wherein the audio signal is approximately 1 volt.

112. A powered volume control as recited in claim 111, wherein the power supply signal is approximately 24 volts.

113. A powered volume control as recited in claim 105, wherein the output circuit further comprises a power/signal cable feed thru for communicating the preamplified signal and the power signal to another powered volume control.

114. A powered volume control as recited in claim 105, wherein the power supply is disposed proximate the input circuit.

115. A powered volume control as recited in claim 36, further comprising a power supply in electrical communication with the input circuit for powering the input circuit and the remote amplifier circuit.

116. A powered volume control as recited in claim 115, wherein the input circuit and the remote amplifier circuit are each connected to a power/signal cable operative to communicate the attenuated audio signal and the power supply signal from the input circuit to the remote amplifier circuit.

117. A powered volume control as recited in claim 116, wherein all power for the remote amplifier circuit is derived from the input circuit via the power/signal cable.

118. A powered volume control as recited in claim 36, wherein the audio signal is a line-level signal.

119. A powered volume control as recited in claim 36, wherein the audio signal is a tape-out signal.

120. A powered volume control as recited in claim 36, wherein the attenuated audio signal is amplified to a level between line-level and speaker level.

121. A powered volume control as recited in claim 36, wherein the attenuated audio signal is approximately 4 volts.

122. A powered volume control as recited in claim 121, wherein the audio signal is approximately 1 volt.

123. A powered volume control as recited in claim 122, wherein the power supply signal is approximately 24 volts.

124. A powered volume control as recited in claim 116, wherein the output circuit further comprises a power/signal cable feed thru for communicating the attenuated audio signal and the power signal to another powered volume control.

125. A powered volume control as recited in claim 116, wherein the power supply is disposed proximate the input circuit.

* * * * *